(12) United States Patent
Sugiyama et al.

(10) Patent No.: US 6,873,233 B2
(45) Date of Patent: Mar. 29, 2005

(54) COMBINATION SWITCH

(75) Inventors: Toshiki Sugiyama, Shizuoka-ken (JP);
Takashi Sakabe, Shizuoka-ken (JP);
Takashi Satoh, Shizuoka-ken (JP);
Akira Serizawa, Shizuoka-ken (JP);
Yoichi Kondo, Shizuoka-ken (JP); Yuji Migimatsu, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/178,338

(22) Filed: Jun. 25, 2002

(65) Prior Publication Data

US 2003/0001705 A1 Jan. 2, 2003

(30) Foreign Application Priority Data

Jun. 25, 2001 (JP) .................................... P 2001-191246
Jan. 10, 2002 (JP) .................................... P 2002-003644

(51) Int. Cl.[7] .............................................. H01H 9/00
(52) U.S. Cl. ...................... 335/205; 335/206; 335/207
(58) Field of Search .................................. 335/205–207

(56) References Cited

U.S. PATENT DOCUMENTS

| 3,946,691 A | * | 3/1976 | Freeman ................... 114/144 E |
| 5,203,555 A | * | 4/1993 | Cannaverde et al. ......... 271/263 |
| 6,118,089 A | | 9/2000 | Stewart et al. ............ 200/61.28 |
| 6,343,883 B1 | * | 2/2002 | Tada et al. .................. 400/196 |

FOREIGN PATENT DOCUMENTS

JP        11-265639        9/1999

* cited by examiner

*Primary Examiner*—Ramon M. Barrera
(74) *Attorney, Agent, or Firm*—Finnegan, Henderson, Farabow, Garrett and Dunner, L.L.P.

(57) ABSTRACT

A combination switch which includes a lever member operable to move relative to a stationary portion, and a position detector for detecting a position of the lever member. The position detector includes a magnet and a Hall effect sensor for detecting a strength of a magnetic field of the magnet. The magnet and the Hall effect sensor are configured to have variable relative positions to each other when the lever member moves.

24 Claims, 26 Drawing Sheets

RANGE A : OFF
RANGE B : TAIL LAMP/WIDTH INDICATOR
RANGE C : HEAD LIGHT

RADIAL MAGNETIZATION

PARALLEL MAGNETIZATION

RANGE A : OFF
RANGE B : TAIL LAMP/WIDTH INDICATOR
RANGE C : HEAD LIGHT

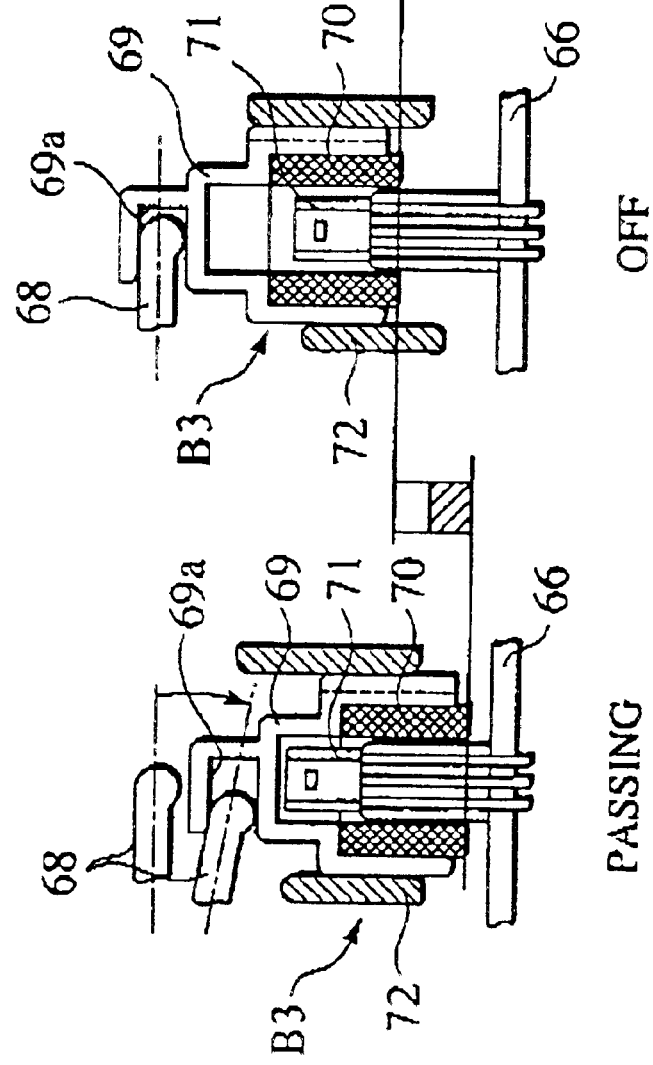
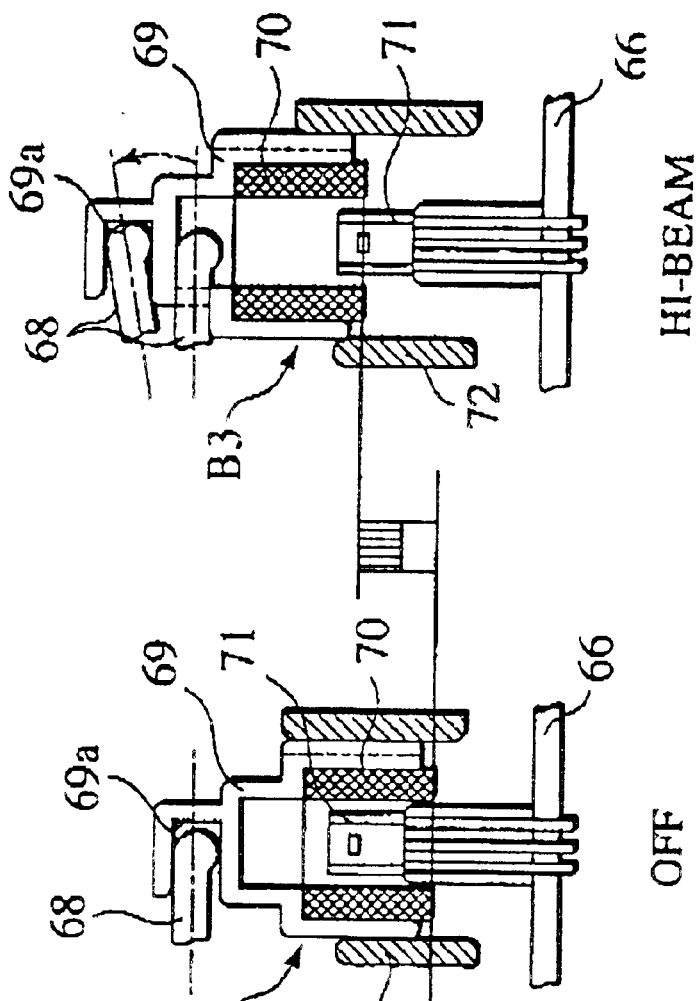
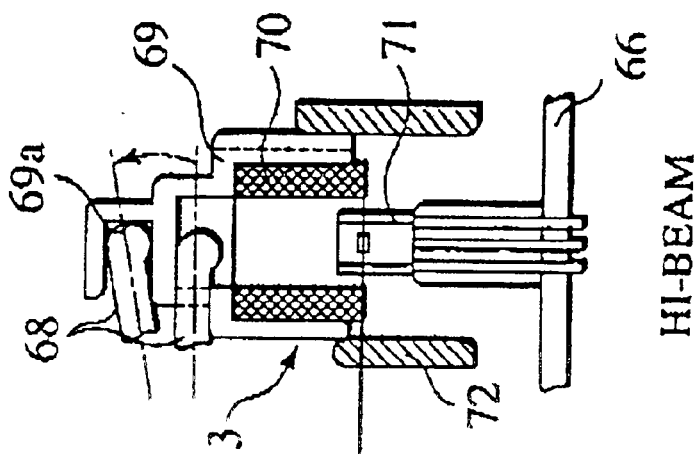

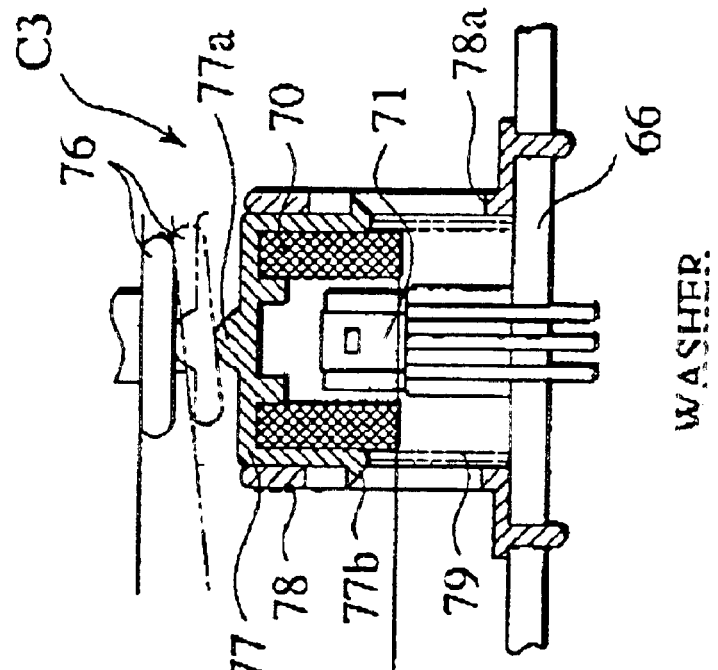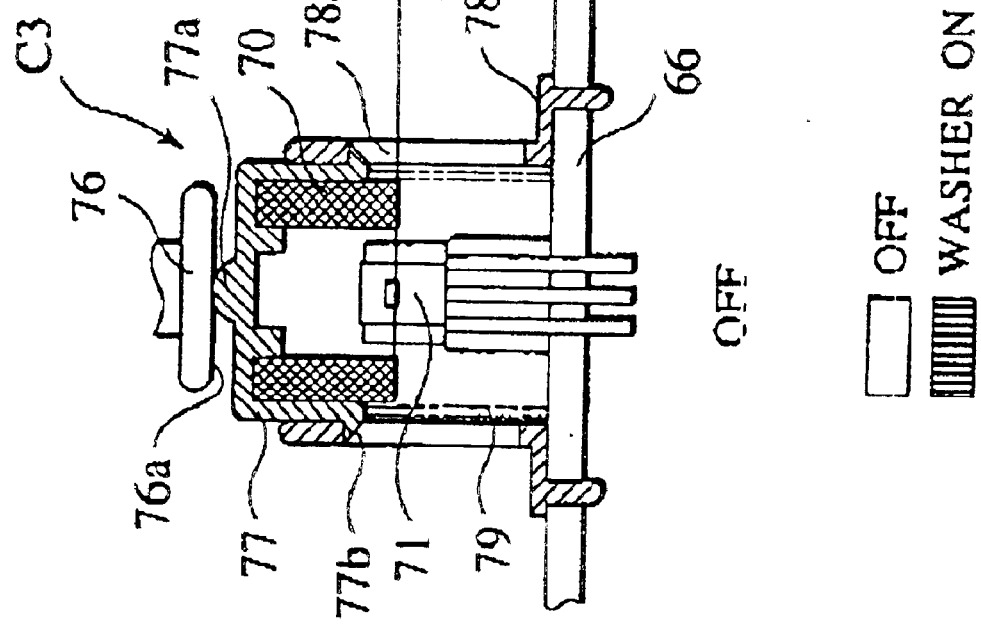

RANGE A : OFF
RANGE B : TAIL LAMP/WIDTH INDICATOR
RANGE C : HEAD LIGHT

RANGE D : PASSING
RANGE E : OFF
RANGE F : HI-BEAM

COMBINATION SWITCH

BACKGROUND OF THE INVENTION

1. Field of the Invention

The present invention relates to a combination switch for turning a headlight and a turn signal on, driving a wiper, and other operations for a vehicle.

2. Description of Related Art

Japanese Patent Application Laid-Open No. 11(1999)-265639 discloses a combination switch having a contact point to be switched on/off by an operation of a control lever, i.e., back-and-forth or up-and-down swinging of a control lever relative to a steering column of a vehicle, or rotation of the control knob provided at a tip of the control lever.

However, as the contact point of the combination switch is contact-type, encountered problems are as follows: wear of each contact point; lack of smoothness of the control lever operation due to large sliding resistance of the contact point; highly accurate assembly required due to a movable contact point to be brought into contact with a plurality of fixed contacts at a predetermined contact pressure; and loosing a proper contact pressure due to lack of reliability of a bent movable contact.

SUMMARY OF THE INVENTION

The object of the present invention is to provide a combination switch which is reliable, durable, smooth to operate, and easy to assemble.

A first aspect of the present invention is a combination switch comprising: a lever member operable to move relative to a stationary portion, and a position detector for detecting a position of the lever member, comprising a magnet and a Hall effect sensor for detecting a strength of a magnetic field of the magnet, the magnet and the Hall effect sensor being configured to have variable relative positions to each other as the lever member moves.

According to the first aspect of the present invention constituted as described above, the relative positions of the magnet and the Hall effect sensor are changed as the lever member moves, and the change of a relative position is detected by the Hall effect sensor. Non-contact detection of the position of the lever member by the magnet and the Hall effect sensor makes the combination switch reliable, durable, smooth to operate, and easy to assemble.

A second aspect of the present invention is the combination switch according to the first aspect, wherein the lever member moves in a plurality of patterns, and the position detector for each of the patterns detects the position of the lever member in the pattern.

According to the second aspect of the present invention constituted as described above, position detection of the lever member in all the pat terns can be carried out in non-contact.

A third aspect of the present invention is the combination switch according to the first aspect, wherein the Hall effect sensor outputs linear or nonlinear characteristics to a magnetic field strength to be detected, in dependence to a position changing quantity of the lever member.

According to the third aspect of the present invention constituted as described above, the output is in dependence to the position changing quantity of the lever member. A relation between the position of the lever member and the output from the Hall effect sensor is simple, and the output from the Hall effect sensor is suitable for being processed.

A fourth aspect of the present invention is the combination switch according to the third aspect, wherein the Hall effect sensor is a programmable Hall effect sensor capable of 2-point calibration for adjusting output values from the Hall effect sensor to provide a variable output range.

According to the fourth aspect of the present invention constituted as described above, in cases where a moving range of the lever member varies, a detection level of a control circuit taking in the output of the Hall effect sensor varies, and the like, the linear or nonlinear conversion can be carried out to obtain the output in a range according to the moving range of the lever member, and having an output characteristic matching the detection level of the control circuit. Changes of the microcomputer or programs for converting positional information of the lever member into a control signal for a corresponding vehicle function are eliminated, or reduced to a minimum.

A fifth aspect of the present invention is the combination switch according to the first aspect, wherein the Hall effect sensor includes one or more of Hall elements lined up in a direction of movement of the Hall effect sensor relative to the magnetic field or the magnet, each of the Hall elements outputs binary value or codes to be used to obtain a positional information of the lever member.

According to the fifth aspect of the present invention constituted as described above, positional information of the lever member can be obtained from binary output values or codes of the Hall effect sensor, thereby simplifying a circuitry of the control circuit.

A sixth aspect of the present invention is the combination switch according to the first aspect, wherein the magnet has a cylindrical shape, an inner periphery thereof is magnetized S and N alternately in a circumferential direction, and the Hall effect sensor is disposed inside the magnet and configured to rotate relative to the magnet as the lever member moves.

According to the sixth aspect of the present invention constituted as described above, the position detector can be constructed with the single Hall effect sensor inside the cylindrical magnet, making it compacts.

A seventh aspect of the present invention is the combination switch according to the first aspect, wherein the magnet has a plate shape and is perpendicularly magnetized, and the Hall effect sensor is disposed above the magnet and configured to move relative to the magnet in a direction perpendicular to the magnet as the lever member moves.

According to the seventh aspect of the present invention constituted as described above, the position detector can be constructed with the single Hall effect sensor in a position close to the flat plate magnet, making it compacts.

A eighth aspect of the present invention is the combination switch according to the first aspect, wherein the magnet has a cylindrical shape, an outer periphery thereof is magnetized S and N alternately in a circumferential direction, and the Hall effect sensor is disposed outside the magnet and configured to rotate relative to the magnet as the lever member moves.

According to the eighth aspect of the present invention constituted as described above, the position detector can be constructed with the single Hall effect sensor outside the cylindrical magnet, making it compacts.

A ninth aspect of the present invention is the combination switch according to the first aspect, wherein the magnet has a disk shape and its top or bottom face is alternately magnetized S and N in a circumferential direction thereof, and the Hall effect sensor is disposed in proximity to the magnet and configured to rotate relative to the magnet as the lever member moves.

According to the ninth aspect of the present invention constituted as described above, the position detector can be constructed with the single Hall effect sensor near the top or bottom face of the disk-shaped magnet, making it compacts.

A tenth aspect of the present invention is a combination switch comprising: a lever body of a lever member operable to swing in two directions relative to a stationary portion; and position detectors for detecting a swing position of the lever body in the two directions, the detected swing position being set as control information of various operation units, wherein one position detector comprises a cylindrical magnet disposed around a swing axis of the lever body, and a magnetometric sensor for detecting a magnetic field strength of the magnet, the magnet and the magnetometric sensor being rotatable to have a variable relative position to each other as the lever body swings, and the other position detector comprises a cylindrical magnet, and a magnetometric sensor for detecting a magnetic field strength of the magnet, movable in an axial direction of the magnet to have a variable relative position inside the magnet as the lever body swings.

According to the tenth aspect of the present invention constituted as described above, the relative positions of the magnet and the magnetometric sensor are changed as the lever body swings, and the change of a relative position is detected by the magnetometric sensor in non-contact. Cylindrical magnets are used to detect swing positions of the lever body in two directions, thus magnet costs can be reduced.

A eleventh aspect of the present invention is a combination switch comprising: a lever body of a lever member operable to swing in two directions relative to a stationary portion; a control knob rotatably provided on the lever body; a first position detector for detecting a rotation position of the control knob: and second and third position detectors for detecting a swing position of the lever body in the two directions, the detected swing position being set as control information of various operation units, wherein the first position detector comprises a cylindrical magnet disposed around a rotation axis of the control knob, and a magnetometric sensor for detecting a magnetic field strength of the magnet, the magnet and the magnetometric sensor being rotatable to have a variable relative position to each other as the control knob rotates, the second position detector comprises a cylindrical magnet disposed around a swing axis of the lever body, and a magnetometric sensor for detecting a magnetic field strength of the magnet, the magnet and the magnetometric sensor being rotatable to have a variable relative position to each other as the lever body swings, and the third position detector comprises a cylindrical magnet, and a magnetometric sensor for detecting a magnetic field strength of the magnet, movable in an axial direction of the magnet to have a variable relative position inside the magnet as the lever body swings.

According to the eleventh aspect of the present invention constituted as described above, magnets used at the first, second and third position detectors are in similar shapes and can be made with a common metallic mold, thus reducing costs.

A twelfth aspect of the present invention is the combination switch according to the eleventh aspect, wherein the lever body is supported on a lever supporting member so as to be swingable in a first swinging direction relative to the stationary portion, and the lever supporting member is swingable in a second swinging direction orthogonal to the first swinging direction.

According to the twelfth aspect of the present invention constituted as described above, the lever body is swung only in two directions orthogonal to each other with respect to the stationary portion. Thus, certainty of operability thereof can be improved.

A thirteenth aspect of the present invention is the combination switch according to the twelfth aspect, further comprising one-direction transmitting means for transmitting swing in the first swinging direction of the lever body without transmitting swing in the second swinging direction of the lever body, the one-direction transmitting means moving the magnetometric sensor relative to the magnet of the third position detector.

According to the thirteenth aspect of the present invention constituted as described above, the magnetometric sensor of the third position detector can be moved relative to the magnet irrespective of the position of the lever body in the second swinging direction. Irrespective of whether the lever body is operated in the second swinging direction or not, a range of the swing of the lever body in the first swinging direction is kept constant, thus giving no uncomfortable feelings to a driver.

A fourteenth aspect of the present invention is the combination switch according to the tenth aspect, wherein the magnetometric sensor outputs linear or nonlinear characteristics to a magnetic field strength to be detected, in dependence to a position changing quantity of the lever body.

According to the fourteenth aspect of the present invention constituted as described above, the output is in dependence to a position changing quantity of the lever body. A relation between the position of the lever body and the output from the Hall effect sensor is simple, and the output from the Hall effect sensor is suitable for being processed.

A fifteenth aspect of the present invention is the combination switch according to the tenth aspect, wherein the magnetometric sensor is a programmable magnetometric sensor capable of 2-point calibration for adjusting output values thereof to provide a variable output range.

According to the fifteen aspect of the present invention constituted as described above, in cases where a moving range of the lever member varies, a detection level of a control circuit taking in the output of the magnetometric sensor varies, and the like, the linear or nonlinear conversion can be carried out to obtain the output in a range according to the moving range of the lever member, and having an output characteristic matching the detection level of the control circuit. Changes of the microcomputer or programs for converting positional information of the lever member into a control signal for a corresponding vehicle function are eliminated, or reduced to a minimum.

BRIEF DESCRIPTION OF TEE DRAWINGS

The invention will now be descried with reference to the accompanying drawings, wherein:

FIG. 22A is an explanatory sectional view of an operation of a third position detector (E portion of FIG. 20) in the left combination switch according to the fifth embodiment of the present invention, showing a passing (or flashing) state where a passing (or flashing) light is turned on or the light is flashed;

FIG. 22B is an explanatory sectional view of an operation of the third position detector (E portion of FIG. 20) in the left combination switch according to the fifth embodiment of the present invention, showing an OFF state where the switch is OFF;

FIG. 22C is an explanatory sectional view of an operation of the third position detector (E portion of FIG. 20) in the left combination switch according to the fifth embodiment of the present invention, showing a high beam state thereof;

FIG. 25A is an explanatory sectional view of a third position detector (F portion of FIG. 23) in the right combination switch according to the fifth embodiment of the present invention, showing an OFF state thereof;

FIG. 25B is an explanatory sectional view of an operation of the third position detector (F portion of FIG. 23) in the right combination switch according to the fifth embodiment of the present invention, showing a washer-ON state thereof;

DETAILED DESCRIPTION OF THE PREFERRED EMBODIMENTS

Figure 1:
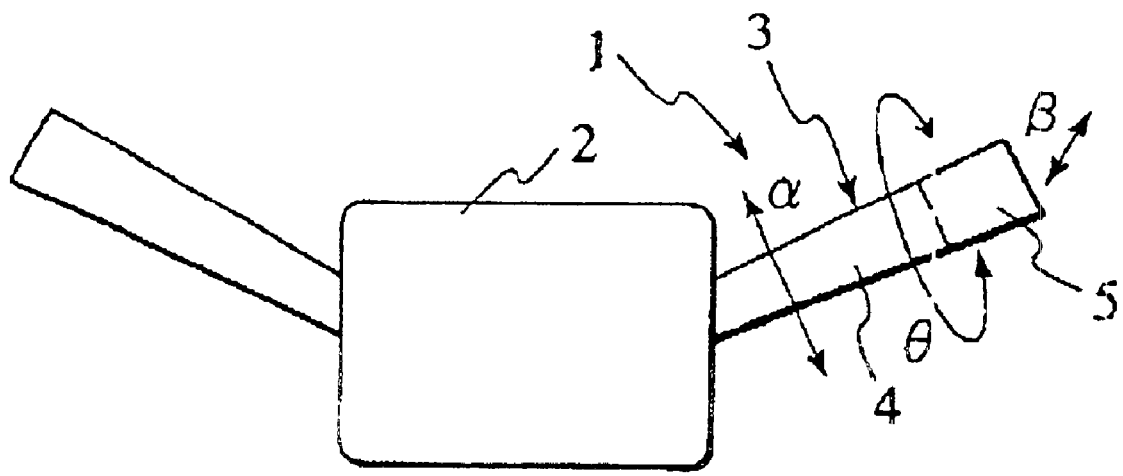
FIG. 1 is a schematic constitutional view of a combination switch according to a first embodiment of the present invention.

Embodiments of the present invention will be explained below with reference to the drawings, wherein like members are designated by like reference characters.

[First Embodiment]

FIGS. 1 to 12 show a first embodiment of the present invention.

As shown on FIG. 1, a combination switch 1 includes a control lever 3 (as a lever member) extended from a steering column 2 as a stationary portion, and this control lever 3 includes a lever body 4 and a control knob 5. The combination switch 1 is constructed such that the entire control lever 3 can be swung in an up-and-down direction of in a vehicle (α direction of FIG. 1), and in a back-and-forth direction of the vehicle (β direction of FIG. 1), and the control knob 5 of the control lever 3 can be rotated with respect to the lever body 4 (θ direction of FIG. 1). Movement of the control lever 3 is detected by each of position detectors A1, A2 and A3, and a result of the detection is used to control various portions off the vehicle. Hereinafter, the combination switch 1 is described in detail.

Figure 2:
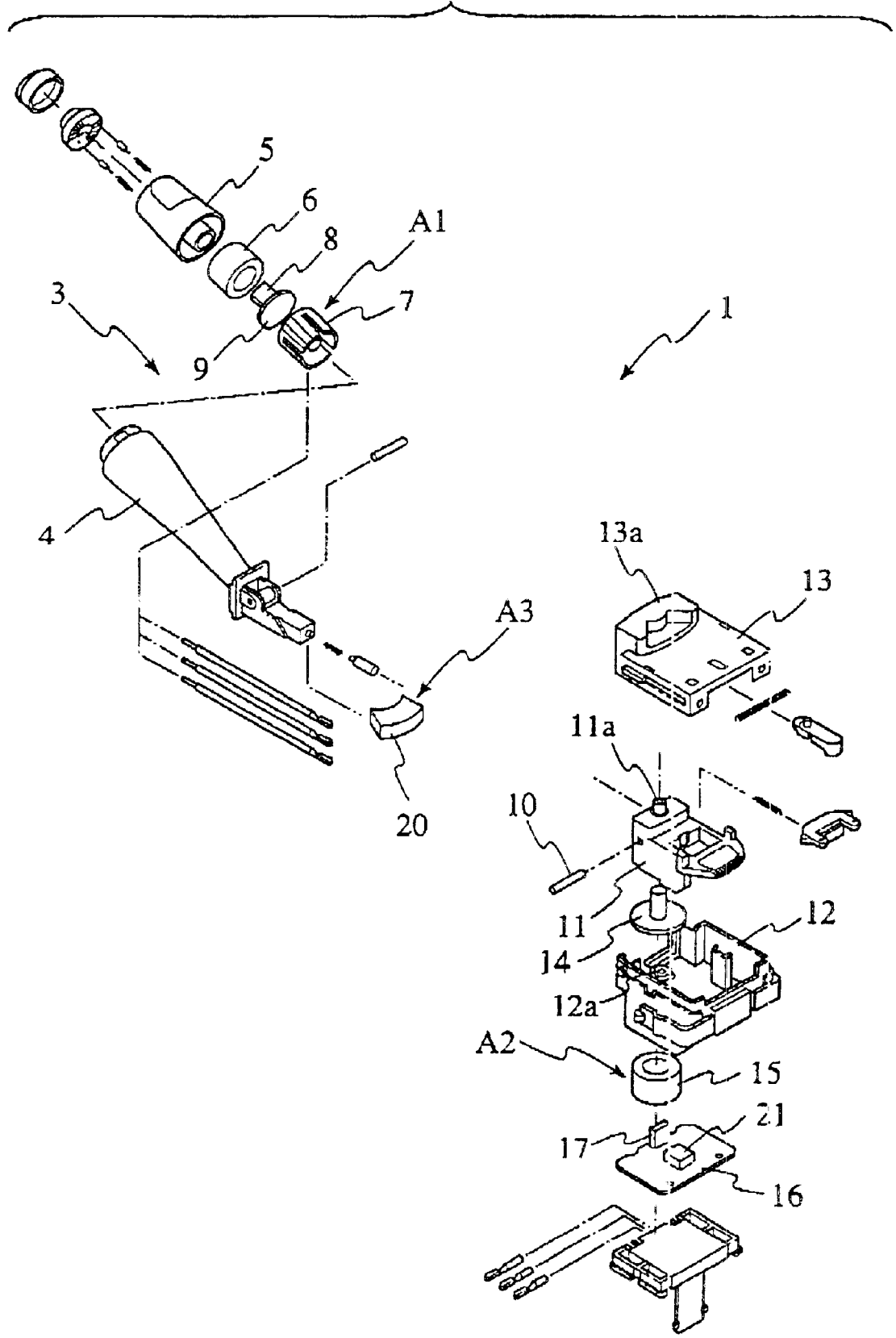
FIG. 2 is an exploded perspective view of the combination switch according to the first embodiment of the present invention.

As shown in FIG. 2. the control lever 3 extended from the steering column 2 includes the lever body 4, and the control knob 5 rotatably provided at a tip of the lever body 4. The first position detector A1 is provided inside the control knob 5 and the lever body 4.

The first position detector A1 fixed to the control knob 5 includes a cylindrical first magnet 6 rotated together with the control knob 5, and a first Hall effect sensor 8 in an internal space of the first magnet 6 fixed through a substrate holder 7 to the lever body 4. The first Hall effect sensor 8 is fixed on a substrate 9 which is fixed to the substrate holder 7. Here, the first Hall effect sensor 8 detects and converts a magnetic field strength into a voltage to output. A second Hall effect sensor 17 or the like described below functions similarly. The first magnet 6 has its axis set to match with a rotation axis of the control knob 5. A rotation of the control knob 5 changes relative rotational positions of the first magnet 6 and the first Hall effect sensor 8. The constitution of the first magnet 6 and the first Hall effect sensor 8 will be detailed later. A detection output of the first Hall effect sensor 8 is led to a control circuit (not shown) for turning a headlight on or the like, and used for controlling the turning the headlight on.

A base end part of the lever body 4 is rotatably supported by a lever supporting member 11 via a pin 10. The lever supporting member 11 has a shaft portion 11a extending in a direction orthogonal to the pin 10. The shaft portion 11a is supported on respective bearings 12a and 13a of a case 12 and an upper cover 13. The control lever 3 is swung up and down together with the lever supporting member 11.

The second position detector A2 includes a cylindrical second magnet 15 fixed through a magnet holder 14 to the shaft portion 11a of the lever supporting member 11, and a second Hall effect sensor 17 in the second magnet 15 provided on a substrate 16 fixed to the case 12. The second magnet 15 has its axis set to match with an axis of the shaft portion 11a of the lever supporting member 11, and up-and-down swinging of the control lever 3 changes relative rotation positions of the second magnet 15 and the second Hall effect sensor 17. The constitution of the second magnet 15 and the second Hall effect sensor 17 will be detailed later. A detection output of the second Hall effect sensor 17 is led to a control circuit (not shown) for turning a turn signal on, driving a wiper or the like.

The third position detector A3 includes a fan-like flat plate third magnet 20 fixed to the base end part of the lever body 4, and a third Hall effect sensor 21 close to an upper surface of the third magnet 20, provided on the substrate 16 fixed to the case 12. When the control lever 3 is swung back and forth of the vehicle, the base end side of the lever body 4 is swung around the pin 10. This swinging changes a distance between the third magnet 20 and the third Hall effect sensor 21. The constitution of the third magnet 20 and the third Hall effect sensor 21 will be detailed later. A detection output of that third Hall effect sensor 21 is led to a control circuit (not shown) for passing (or flashing), driving a washer or the like.

Figure 3A:
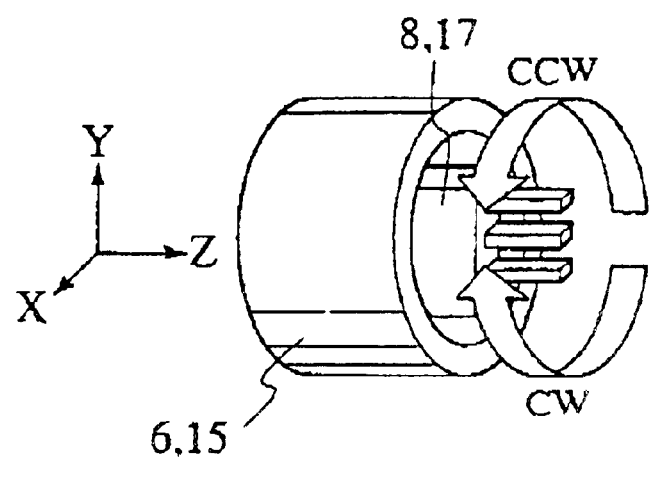
FIG. 3A is a perspective view showing position of a cylindrical magnet and a Hall effect sensor of a position detector in the combination switch according to the first embodiment of the present invention.
Figure 3B:
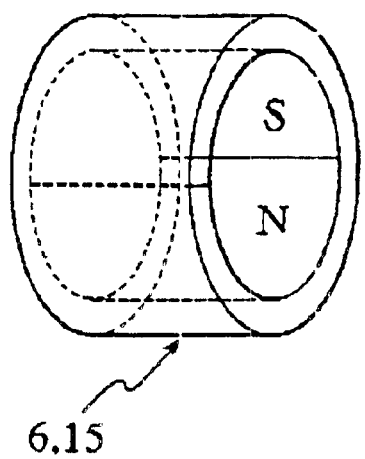
FIG. 3B is a perspective view showing a magnetized state of the cylindrical magnet of FIG. 3A.
Figure 3C:
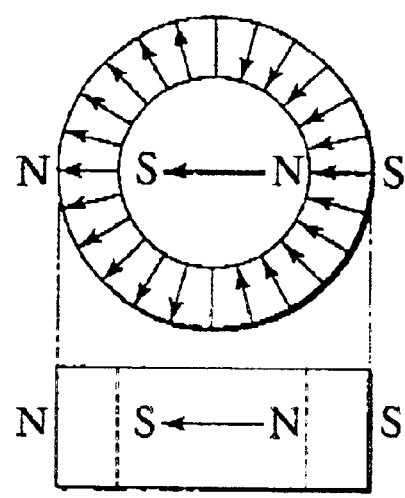
FIG. 3C is an explanatory view showing radial magnetization of the cylindrical magnet of FIG. 3A.
Figure 3D:
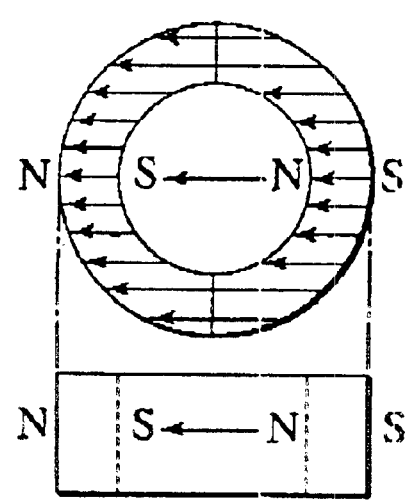
FIG. 3D is an explanatory view showing parallel magnetization of the cylindrical magnet of FIG. 3A.
Figure 4:
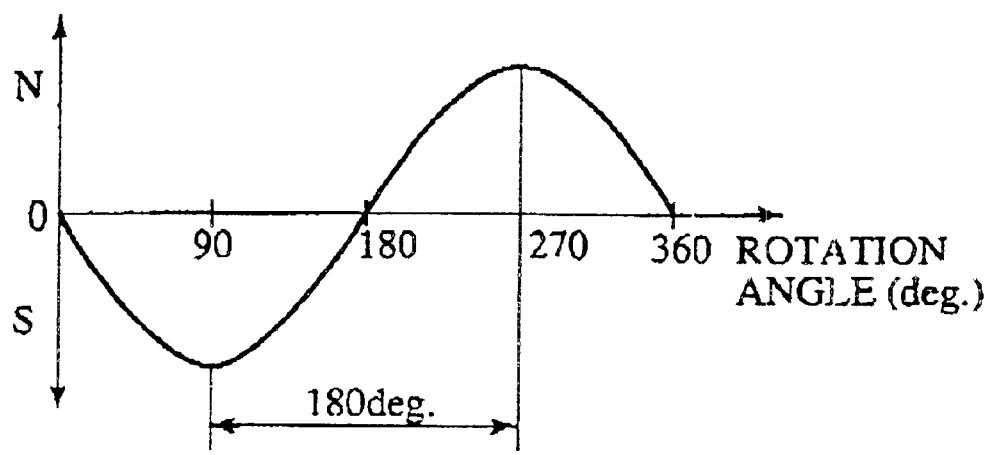
FIG. 4 is a characteristic line diagram showing a magnetic field strength received by the Hall effect sensor with respect to a rotation angle of the cylindrical magnet of the position detector in the combination switch according to the first embodiment of the present invention.
Figure 5:
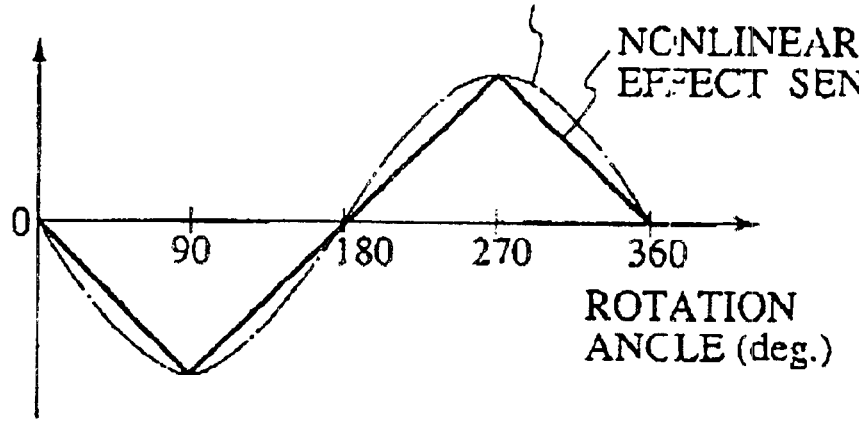
FIG. 5 is a characteristic line diagram showing output voltages of the Hall effect sensors with respect to the rotation angle of the cylindrical magnet of FIG. 4 in the cases of nonlinear and linear Hall effect sensor.

Next, the constitution of the first and second position detectors A1 and A2 will be described in detail. As shown in FIGS. 3A to 3D, the magnets 6 and 15 of the first and second position detectors A1 and A2 are magnetized in parallel in a diameter direction, or magnetized in a radial direction. In central regions of internal spaces of the magnets 6 and 15, parallel magnetic fields are obtained in directions perpendicular to rational axes. In the first and second Hall effect sensors 8 and 17, approximate central regions in the magnets 6 and 15 are set as detection points, and an X direction of FIG. 3A is set as a direction of magnetic field to be detected. A magnetic field strength of each of the Hall effect sensors 8 and 17 has an SIN waveform similar to that shown in FIG. 4. If each of the Hall effect sensors 8 and 17 is a linear Hall effect sensor, an output of an SIN waveform similar to that indicated by a chain line shown in FIG. 5 is obtained. If each of the Hall effect sensors 8 and 17 is a nonlinear Hall effect sensor having an SIN waveform-linear waveform conversion characteristic, an output of a triangular waveform similar to that indicated by a solid line in FIG. 5 is obtained. Operation rotation angles of the control knob 5 and the control lever 3 in a vehicle up-and-down direction are less than 180°. Thus, for example, if a range of 90 to 270° in FIG. 5 is set as a range of rotation angle of the control knob 5 or that of the control lever 3 in the vehicle up-and-down direction, detection outputs are obtained from the Hall effect sensors 8 and 17 according to rotation positions.

Figure 6:
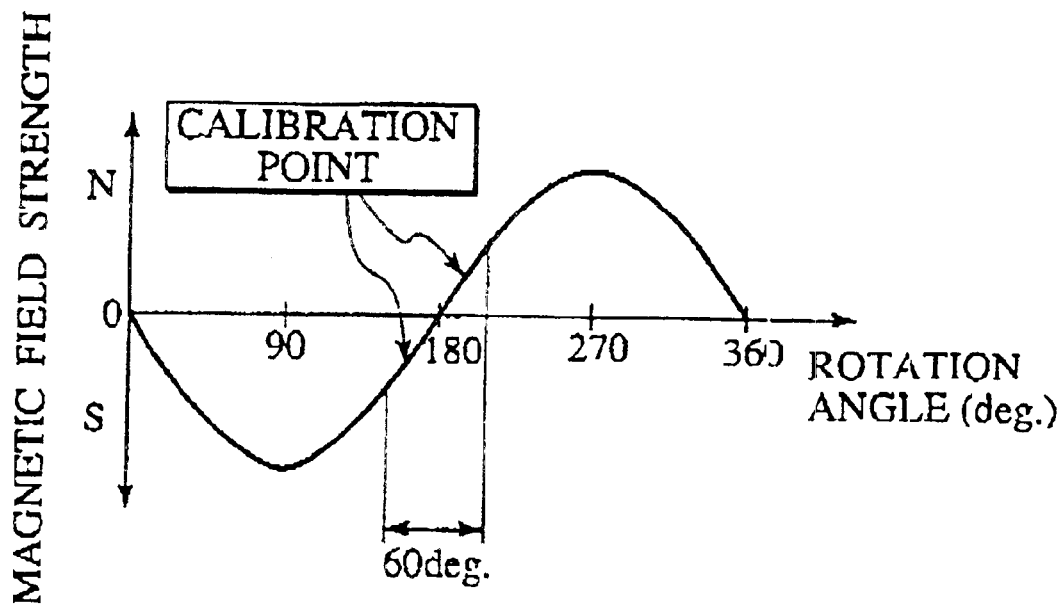
FIG. 6 is a characteristic line explanatory diagram explaining that a point of ±30° from a position of a rotation angle 180° of the cylindrical magnet is set as a calibration point at the position detector in the combination switch according to the first embodiment of the present invention.
Figure 7:
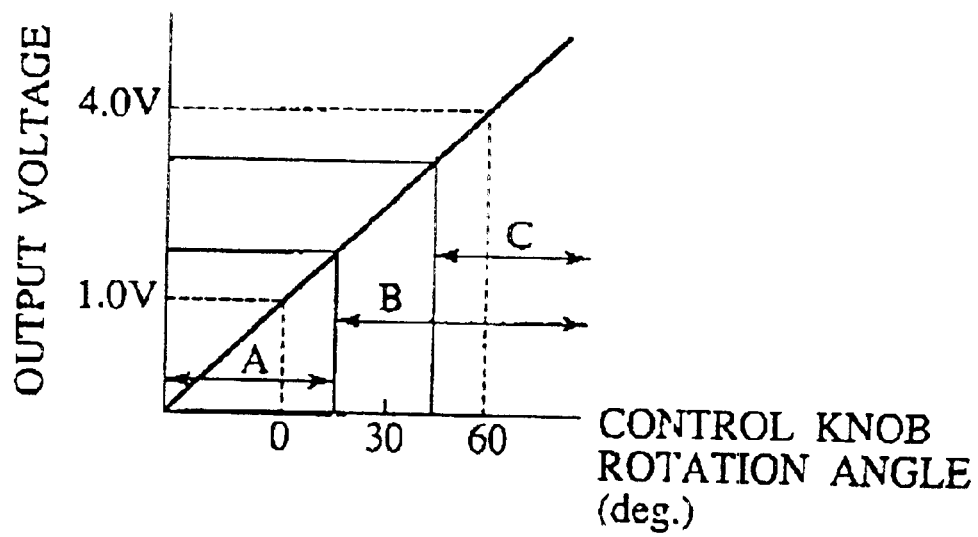
FIG. 7 is a characteristic line diagram of an output voltage of the Hall effect sensor with respect to a rotation angle of a control knob, showing a rotation angle range of the control knob and a corresponding operation state in the combination switch according to the first embodiment of the present invention.

Next, the detailed constitution of the first magnet 6 and the first Hall effect sensor 8 at the first position detector A1 will be described as a further specific example. As the first hall effect sensor 8, the above-described nonlinear Hall effect sensor is used, and a 2-point calibrated programmable Hall effect sensor is used, which can variably set output characteristics according to set levels by setting desired detection levels for detection points of two places. An angle detection range of the control knob 5 is 60°. Accordingly, by setting ±30°0 from a position of a magnetic field 0 (rotation angle: 180°) in FIG. 4 as an angle detection range, the first magnet 6 and the first Hall effect sensor 8 are assembled. Then, in a rotation range of 0 to 60°, as shown in FIG. 6. the Hall effect sensor 8 is calibrated so as to output 1.0 to 4.0 V. Thus, as shown in FIG. 7, an output waveform changed linearly with respect to a rotation angle is obtained. This output voltage is divided by the number of times of operating a switch (i.e., divided into 3 parts), and the control circuit (not shown) is programmed to correspond to turning the light OFF in a range of an A output range, a tail lamp/width indicator in a range of a B output voltage, and turning the headlight ON in a range of a C output voltage. The constitution of the second position detector A2 can be similarly set.

Figure 8:
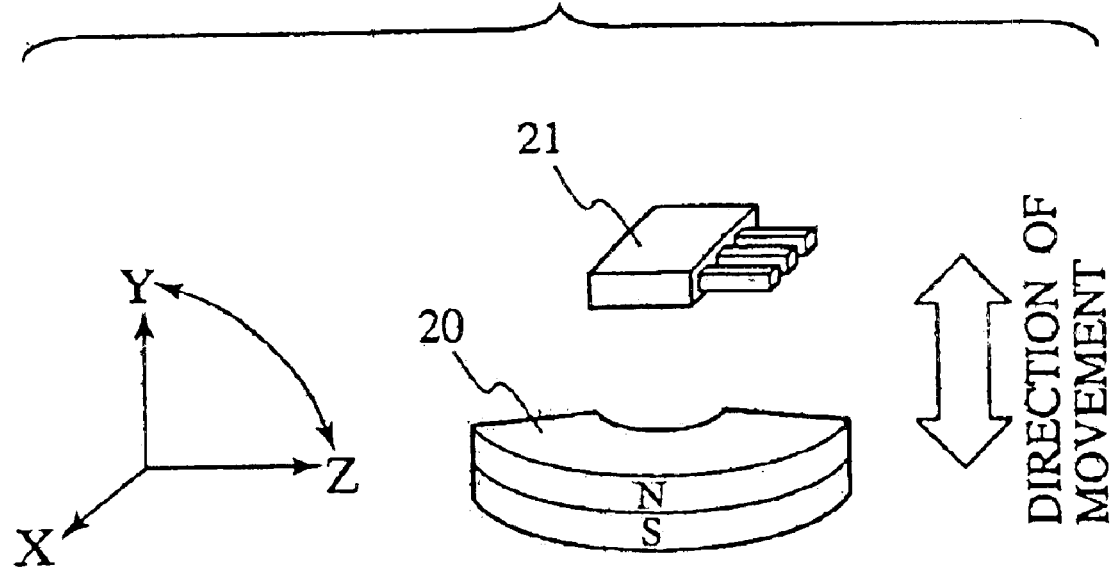
FIG. 8 is a perspective view showing position of a flat plate magnet and the Hall effect sensor of the position detector in the combination switch according to the first embodiment of the present invention.
Figure 9:
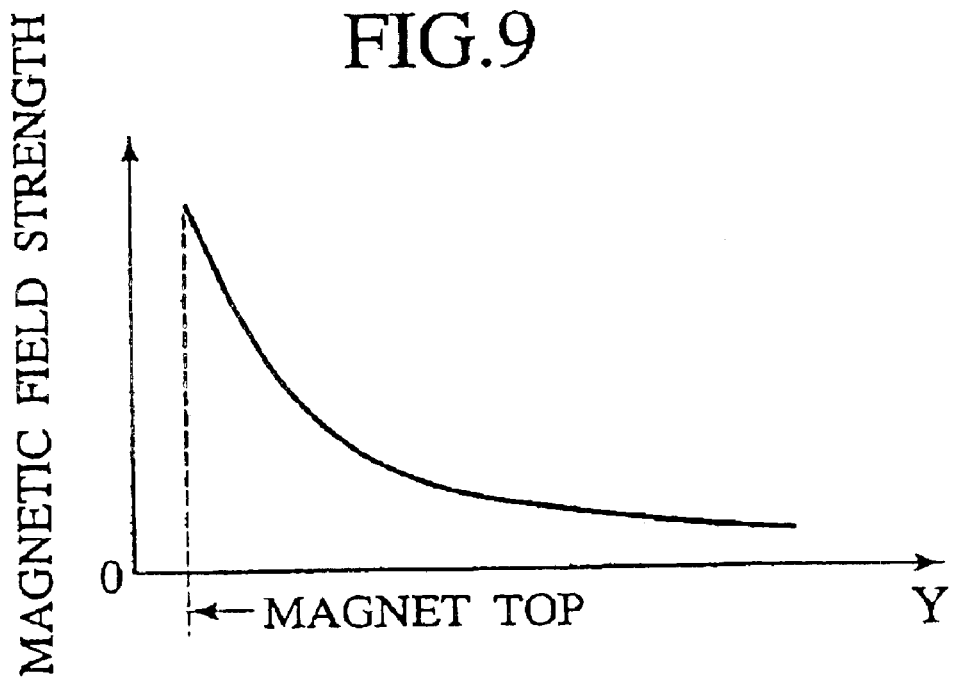
FIG. 9 is a characteristic line diagram showing a magnetic field strength when the Hall effect sensor is moved in a separation direction from a nearest position of the position detector in the combination switch according to the first embodiment of the present invention.

Next, the constitution of the third position detector A3 will be described. As shown in FIG. 8, the magnet 20 of the third position detector A3 has S and N poles magnetized in a fan-like flat plate thickness direction. A magnetic field strength in a direction (Y direction in FIG. 8) away from a nearest position on the magnet 20 exhibits a characteristic of a magnetic field strength represented by a quadratic function as shown in FIG. 9. The Hall effect sensor 21 is installed in parallel to the upper surface of the magnet 20, both being arranged for relative movement in the (Y direction of FIG. 8. Accordingly, if the Hall effect sensor 21 is a linear Hall effect sensor, an output of a quadratic function waveform similar to that shown in FIG. 9 is obtained. If the Hall effect sensor 21 is a nonlinear Hall effect sensor of a quadratic function waveform-linear waveform conversion type, an output of a linear waveform similar to that shown in FIG. 7 is obtained. Then, as in the case of the first and second position detectors A1 and A2, the output waveform is divided by the number of times of operating the switch, and the control circuit (not shown) is programmed to drive the operation unit in each output voltage range.

In the foregoing constitution, when the control knob 5 of the control lever 3 is rotated with respect to the lever body 4 (0 direction operation in FIG. 1), the first magnet 6 of the first position detector A1 is rotated, a change in a magnetic field caused by the rotation is detected and outputted by the first Hall effect sensor 8, and turning the headlight on or the like is controlled according to its output level. When the entire control lever 3 is swung in an up-and-down direction of the vehicle (β direction operation in FIG. 1), the magnet 15 of the second position detector A2 is rotated, a change in a magnetic field caused by the rotation is detected and outputted by the second Hall effect sensor 17, and turning the turn signal on or the like is controlled according to its output level. When the entire control lever 3 is swung in a back-and-forth direction of the vehicle (β direction operation in FIG. 1), the third magnet 20 is moved In a far-and-near direction of the third Hall effect sensor 21. A change in a magnetic field caused by the movement is detected and outputted by the third Hall effect sensor 21, and the passing (or flashing), the washer or the like is controlled according to its output level.

Thus, in the combination switch 1 of the present invention, relative positions between the magnets 6, 15 and 20 and the Hall effect sensors 8, 17 and 21 can be varied by the movement of the control lever 3, and changes in magnetic field intensities following such relative position changes are detected by the Hall effect sensors 8, 17 and 21. Since the moving position of the control lever 3 can be detected in non-contact, reliability including durability can be improved, and high operability can be provided. Moreover, no high assembling accuracy is required for the position detectors A1, A2 and A3.

In the first embodiment, the movement of the control lever 3 has a plurality of patterns (3 patterns), and the position detectors A1, A2 and A3 for the movement of the control lever 3 of the respective patterns all include the magnets 6, 15 and 20, and the Hall effect sensors 8, 17 and 21. Accordingly, since position detection of the control lever 3 based on all the operation patterns of the control lever 3 can be carried out in non-contact, reliability including durability can be improved for all the operations of the control lever 3, and high operability can be provided. Moreover, no high assembling accuracy is required for the position detectors A1, A2 and A3.

In the first embodiment, as the Hall effect sensor 8, 17 and 21, the nonlinear Hall effect sensors are used, in which outputs nonlinear characteristics to the detected magnetic field strength characteristics, and from these nonlinear Hall effect sensors, outputs linear to a position changing quantity of the control lever 3 are obtained. Since the detection outputs linear to the position changes of the control lever 3 are obtained, it is possible to easily grasped a relation between the position of the control lever 3 and each of the Hall effect sensors 8, 17 and 21, facilitating processing (program setting processing to the control circuit or the like) of the detection signals of the Hall effect sensors 8, 17 and 21.

Figure 10:
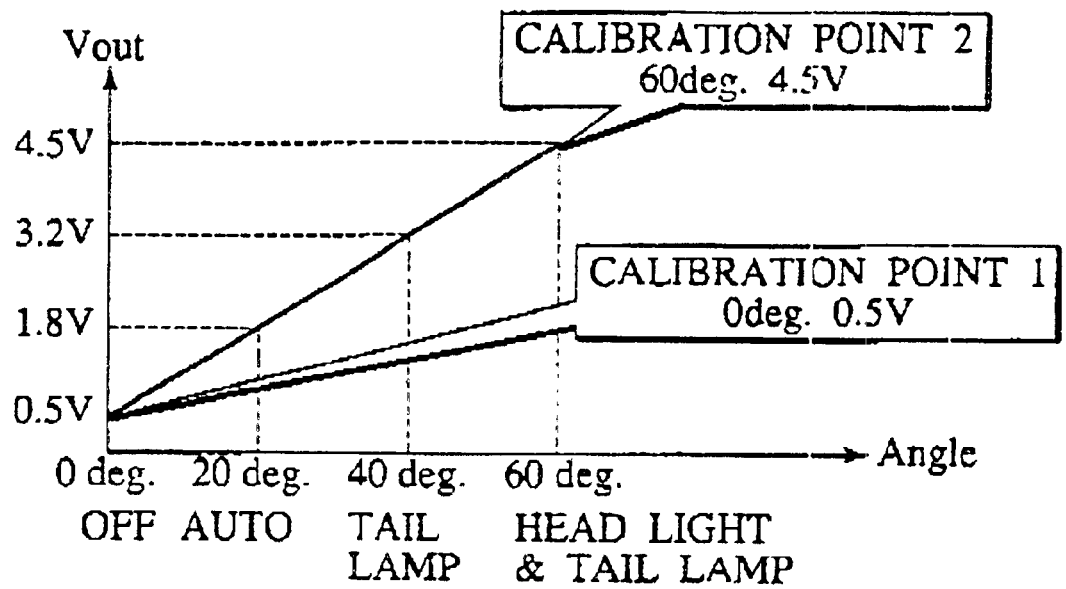
FIG. 10 is a diagram showing an output characteristic of the Hall effect sensor of the position detector of FIG. 8. 2-point calibrated for a first type of vehicle.
Figure 11:
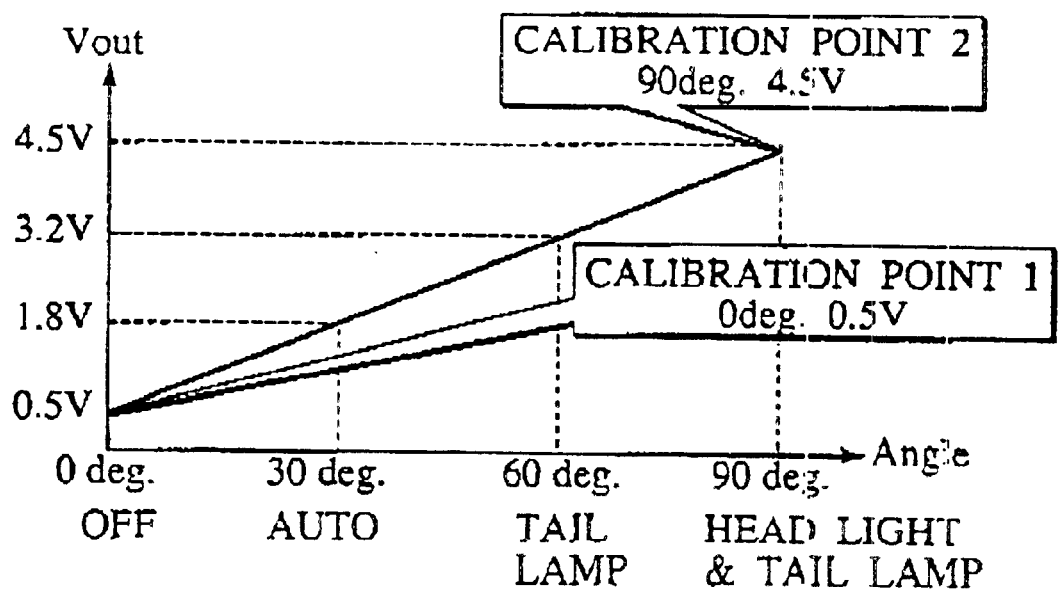
FIG. 11 is a diagram showing an output characteristic of the Hall effect sensor of the position detector of FIG. 8. 2-point calibrated for a second type of vehicle.
Figure 12:
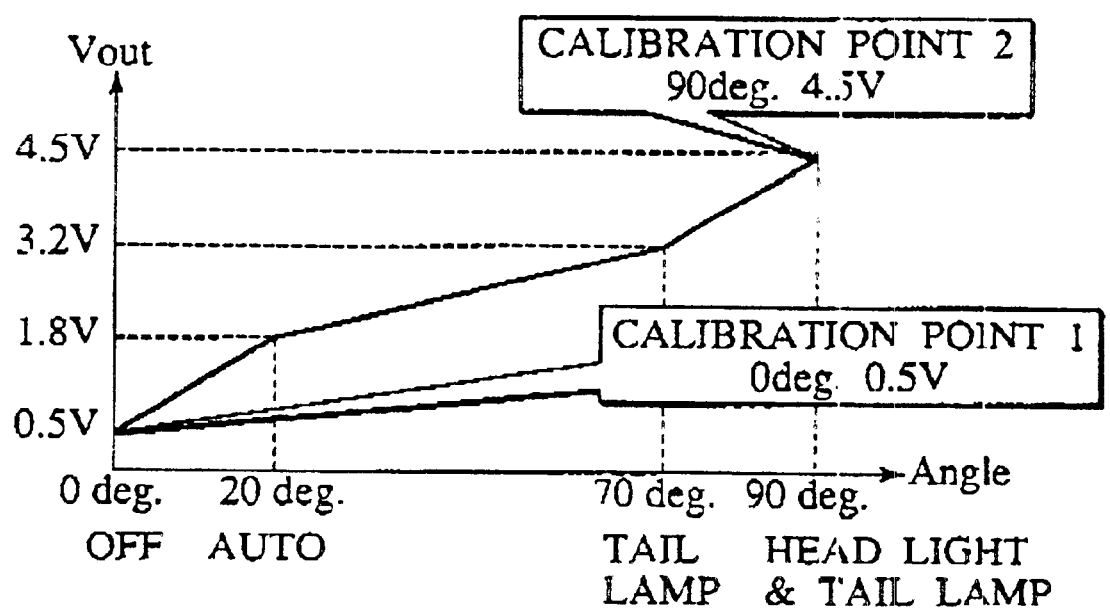
FIG. 12 is a diagram showing an output characteristic of the nonlinear Hall effect sensor of the position detector of FIG. 8. 2-point calibrated for a third type of vehicle.

In the first embodiment, as the Hall effect sensors 8, 17 and 21, the 2-point calibrated programmable Hall effect sensors are used, in which desired output levels are set for detection points of two places, and thus output characteristic can be variably set according to the set levels. Accordingly, in cases where the moving range of the control lever 3 is varied, the steering column 2 is shared by left-hand steering and right-hand steering vehicles, detection levels of the control circuit for taking in the detection outputs of the Hall effect sensors 8, 17 and 21 are varied or the like, detection outputs of output characteristics can be outputted in a range according to the moving range of the control lever 3, and according to the detection level of the control circuit. Thus, the Hall effect sensors 8, 17 and 21 can be made compatible to a change from the left-hand steering vehicle to the right-hand steering vehicle, or functions of various types of vehicles. To explain more in detail, FIG. 10 shows an output characteristic of the 2-point calibrated Hall effect sensor for the first type of vehicle. If a change is made from the vehicle type of such an output characteristic to the second type of vehicle having a wide rotation range of the control lever 3 shown in FIG. 1, by performing predetermined 2-point calibration, an output of the Hall effect sensor at each function (automatic, tail lamp or headlight) can be made similar to that of the first type of vehicle of FIG. 10. Also, as shown in FIG. 12, even if a change is made to the third type of vehicle, in which a rotation range interval of the functions are varied, by using the nonlinear Hall effect sensor, an output of the Hall effect sensor at each function can be made similar to that of the first type of vehicle of FIG. 10. Thus, changes of the microcomputer or programs for converting positional information of the control lever 3 into a control signal for a corresponding vehicle function can be eliminated, or reduced to a minimum.

In the first embodiment, the magnets 6 and 15 of the first and second position detectors A1 and A2 are cylindrical, and magnetized in parallel in a diameter direction or magnetized in a radial direction. The Hall effect sensors 8 and 17 are disposed inside the magnets 6 and 15. The magnets 6 and 15 and the Hall effect sensors 8 and 17 are rotated and moved relative to each other by the movement of the control lever 3. Accordingly, since it is only necessary to dispose the cylindrical magnets 6 and 15, and the single Hall effect sensors 8 and 17 therein, the position detectors A1 and A2 can be constructed by using only the single Hall effect sensors 8 and 17, and made compact.

In the first embodiment, the magnet 20 of the third position detector A3 has a flat plate shape, and S and N poles are magnetized in its thickness direction. The Hall effect sensor 21 is disposed in a near position on the flat plate of the magnet 20. The magnet 20 and the Hall effect sensor 21 are moved relative to each other in the far-and-near direction by the movement of the control lever 3. Thus, since the flat plate magnet 20 and the single Hall effect sensor 21 in its near position are disposed, the position detector A3 can be constructed by using only the single Hall effect sensor 21, and made compact.

According to the embodiment, by using a digital output type as the Hall effect sensor, reliability of position detection is improved more.

[Second Embodiment]

FIGS. 13A to 16 show a second embodiment of the present invention.

Figure 13A:
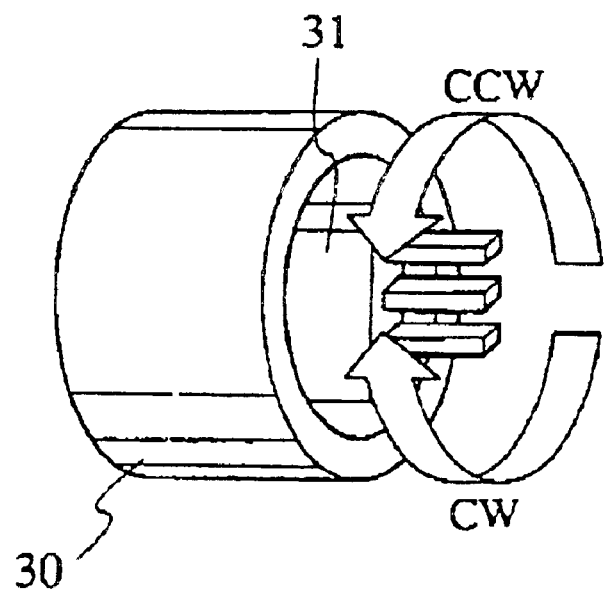
FIG. 13A is a perspective view showing position of a magnet and a Hall effect sensor of a position detector in a combination switch according to a second embodiment of the present invention.
Figure 13B:
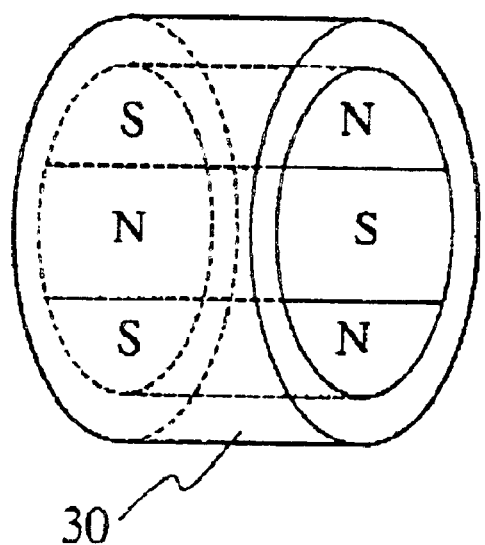
FIG. 13B is a perspective view showing a magnetized state of the magnet of the position sensor in the combination switch according to the second embodiment of the present invention.
Figure 14:
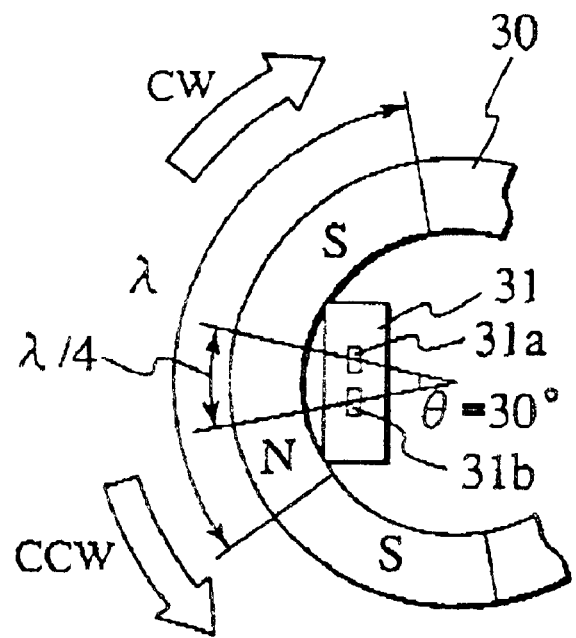
FIG. 14 is a view showing a positional relation between a magnetization pattern and two hall elements of the Hall effect sensor when seen from an axial direction of the magnet of the position detector in the combination switch according to the second embodiment of the present invention.
Figure 15:
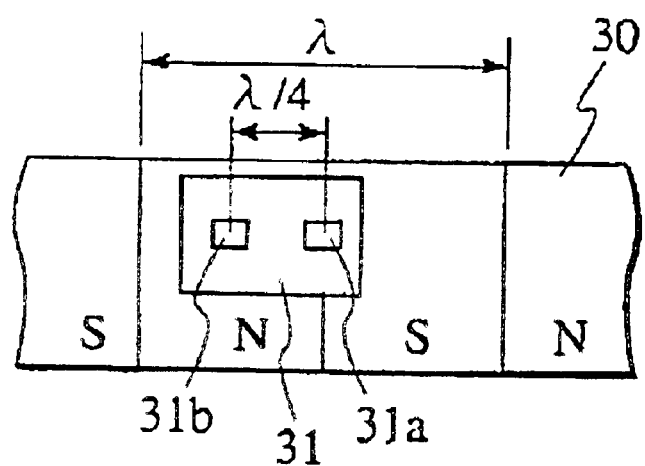
FIG. 15 is a view showing a positional relation between a magnetization pattern and two hall elements of the Hall effect sensor when developed and seen from a radial direction of the magnet of the position detector in the combination switch according to the second embodiment of the present invention.

The second embodiment provides a constitution of first and second position detectors A1 and A2 different from those of the first embodiment. As shown in FIGS. 13A and 13B, a magnet 30 has a cylindrical shape, and S and N poles, totally 6 poles, alternately magnetized in a circumferential direction thereof. That is, a width of magnetization per pole is 60°. A Hall effect sensor 31 includes two hall elements 31a and 31b disposed in positions shifted with respect to a rotation direction of the magnet 30 (i.e., moving direction corresponding to movement of a control lever). These hall elements 31a and 31b output binary values (Hi, and Lo) or codes according to magnetic field intensities. As shown in FIGS. 14 and 15, shifting quantities of the two hall elements 31a and 31b are set to λ/4 (or 3λ/4, 5λ/4) to a magnetization pitch λ. Accordingly, as shown in FIG. 13A, output waveforms of the two elements 31a and 31b are phase-shifted by only 90°. Detection outputs of the hall elements 31a and 31b are led to the control circuit (not shown). At the control circuit, positional information is obtained by combining the binary outputs of the hall elements 31a and 31b.

Figure 16:
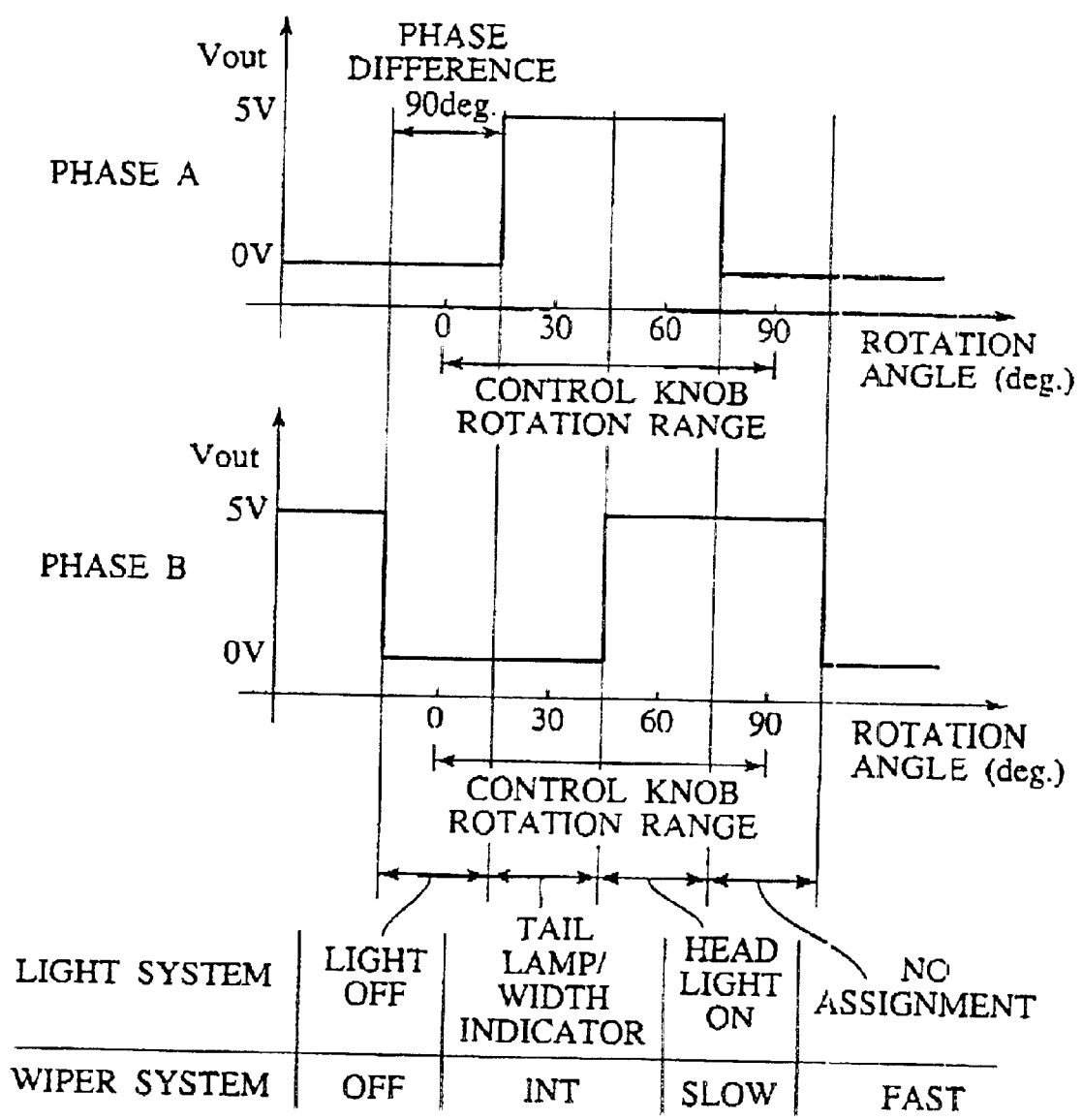
FIG. 16 is a diagram showing output waveforms of the two hall elements of the Hall effect sensor of the position detector in the combination switch according to the second embodiment of the present invention.

Then, as shown in FIG. 16, the control circuit (not shown) is programmed to correspond to turning the light OFF in an Lo-Lo output voltage range, tail lamp/width indicator in an Hi-Lo output voltage range, turning the headlight on in an Hi-Hi output voltage range, and no assignment in an Lo-Hi output voltage range. In the light system, 3-stage switching is carried out, and thus one stage remains. In the wiper system, however, 4-stage switching can be carried out, e.g., OFF-INT-Slow-Fast.

By the second embodiment, operations/advantages similar to those of the first embodiment are contained. In the second embodiment, the Hall effect sensor 31 includes the plurality of hall elements 31a and 31b, which are disposed in the positions shifted in the moving direction corresponding to the movement of the control lever, and output binary values according to magnetic field intensities. By combining the binary outputs of the hall elements 31a and 31b, positional information is obtained. Thus, since positional information of the control lever can be obtained from the binary output values from the Hall effect sensor 31, position determination is easy at the control circuit (not shown), and circuitry can be simplified.

According to the embodiment, by using a digital output type as the Hall effect sensor 1, reliability of position detection can be improved more.

Note that, in the second embodiment, the two hall elements 31a and 31b are provided by being shifted. However, if 3 or more hall elements are disposed by being shifted so as to obtain phase-shifted outputs, 6 or more stages of switching can be carried out.

[Third Embodiment]

Figure 17:
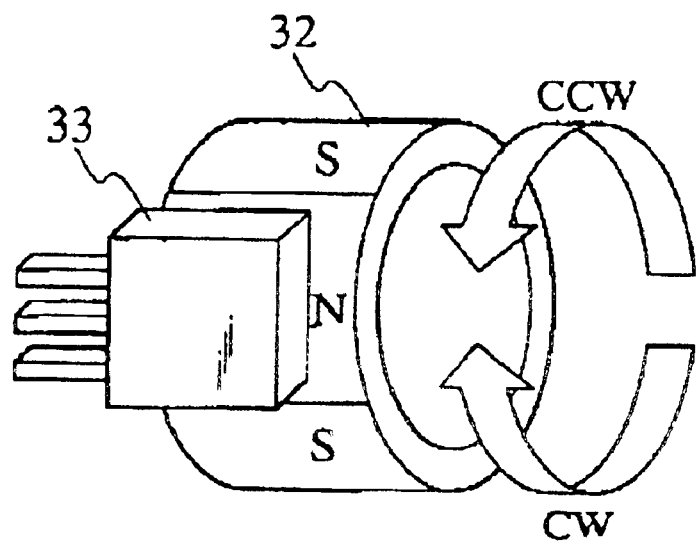
FIG. 17 is a perspective diagram showing position of a magnet and a Hall effect sensor of a position detector in a combination switch according to a third embodiment of the present invention.

FIG. 17 shows a third embodiment of the present invention. The third embodiment provides a constitution of first and second position detectors A1 and A2 different from those of the first embodiment. As shown in FIG. 17, a magnet 32 has a cylindrical shape, and S and N poles, totally 6 poles, alternately magnetized in a circumferential direction thereof. That is, a width of magnetization per pole is 60°. A Hall effect sensor 33 is disposed in a near position outside the cylindrical magnet 32. The magnet 32 and the Hall effect sensor 33 are configured so as to be rotated and moved relative to each other by a movement of a control lever.

By the third embodiment, operations/advantages similar to those of the first embodiment are obtained. In the third embodiment, since it is only necessary to dispose the cylindrical magnet 32 and the single Hall effect sensor 33 in the outside thereof, the position detector can be constructed by using only the single Hall effect sensor 33.

According to the embodiment, by using a digital output type as the Hall effect sensor, reliability of position detection can be improved more.

[Fourth Embodiment]

Figure 18:
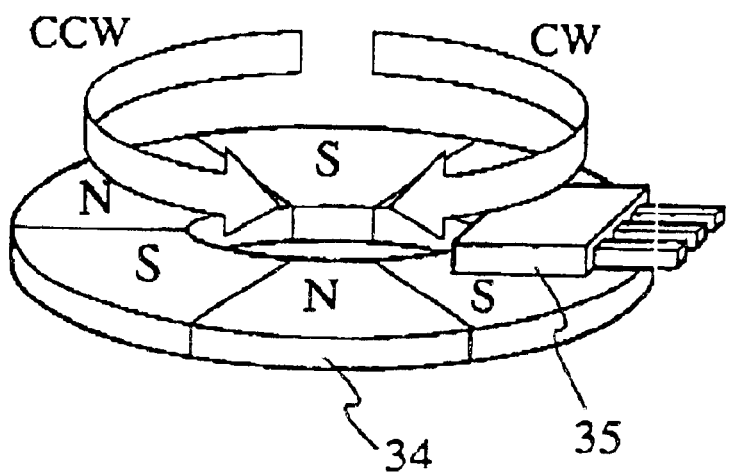
FIG. 18 is a perspective diagram showing position of a magnet and a Hall effect sensor of a position detector in a combination switch according to a fourth embodiment of the present invention.

FIG. 18 shows a fourth embodiment of the present invention. The fourth embodiment provides a constitution of first and second position detectors A1 and A2 different from those of the first embodiment. As shown in FIG. 18, a magnet 34 has a disk shape with top or bottom face magnetized S and N poles, totally 6 poles, alternately in a circumferential direction thereof. That is, a width of magnetization per pole is 60°. Moreover, a Hall effect sensor 35 is disposed in a near position on the disk of the magnetic 34, and the magnet 34 and the Hall Effect sensor 35 are configured so as to be rotated and moved relative to each other by a movement of a control lever.

A fourth embodiment provides operations/advantages similar to those of the first embodiment. Also, in the fourth embodiment. since it is only necessary to dispose the disk-shape magnet 34 and the Hall effect sensor 35 in the near position on its surface, the position detector can be constructed by using only the single Hall effect sensor 35, and made compact.

Note that, according to the first embodiment, the magnets 6, 15 and 20 are provided in the moving side, and the Hall effect sensors 8, 17 and 21 are provided in the fixed side. Accordingly, the magnets 6, 17 and 20 and the Hall effect sensors 8, 17 and 21 are configured to be moved relative to each other in conjunction with the operation of the control lever 3. Conversely, the magnets 6, 17 and 20 may be provided in the fixed side, and the Hall affect sensors 8, 17 and 21 may be provided in the moving side. Preferably, however, the Hall effect sensors 8, 17 and 21 are preferably provided in the fixed side, because of an advantage of easy wiring or the like.

According to the embodiment, by using a digital output type as the Hall effect sensor, reliability of position detection can be improved more.

[Fifth Embodiment]

Next, a fifth embodiment will be described.

Figure 19:
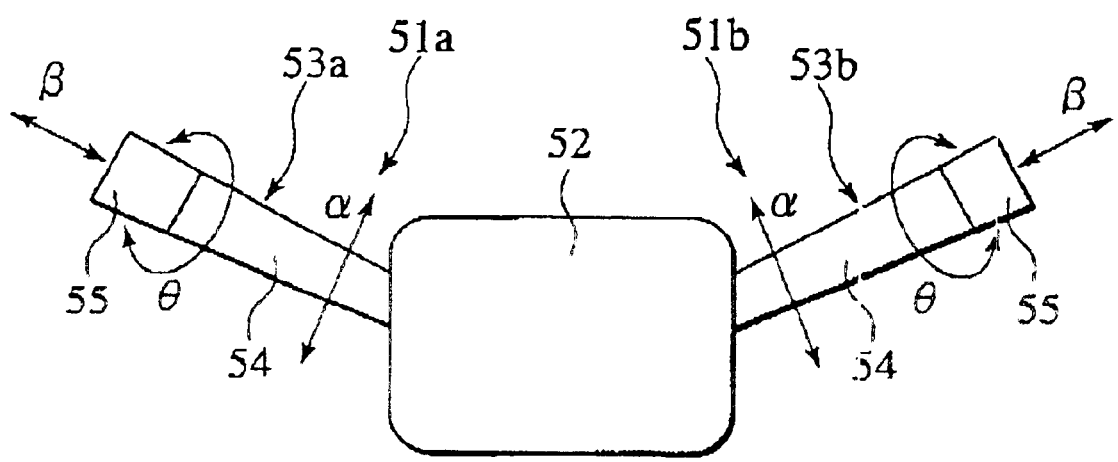
FIG. 19 is a schematic constitutional view of a switch unit including two left and right combination switches according to a fifth embodiment of the present invention.

As shown in FIG. 19, left and right combination switches 51a and 51b respectively include control levers 53a and 53b extended left and right from a steering column 52 as a stationary portion. Each of the left and right operation levers 53a and 53b includes a lever body 54 and a control knob 55. The combination switches 51a and 51b are constructed such that the entire left and right control levers 53a and 53b can be swung in an up-and-down direction of a vehicle (α direction operation of FIG. 19), and in a back-and-forth direction of the vehicle (β direction operation of FIG. 19), and the control knobs 55 of the left and right control levers 53a and 53b can be rotated with respect to the lever main bodies 54 (θ direction operation of FIG. 19). Movement of the control levers 53a and 53b is detected by each of position detectors B1, B2, B3, C1, C2 and C3, and a result of the detection is used as control information of each of various portions to be operated. Hereinafter, the left and right combination switches 51a and 51b are described in detail.

Figure 20:
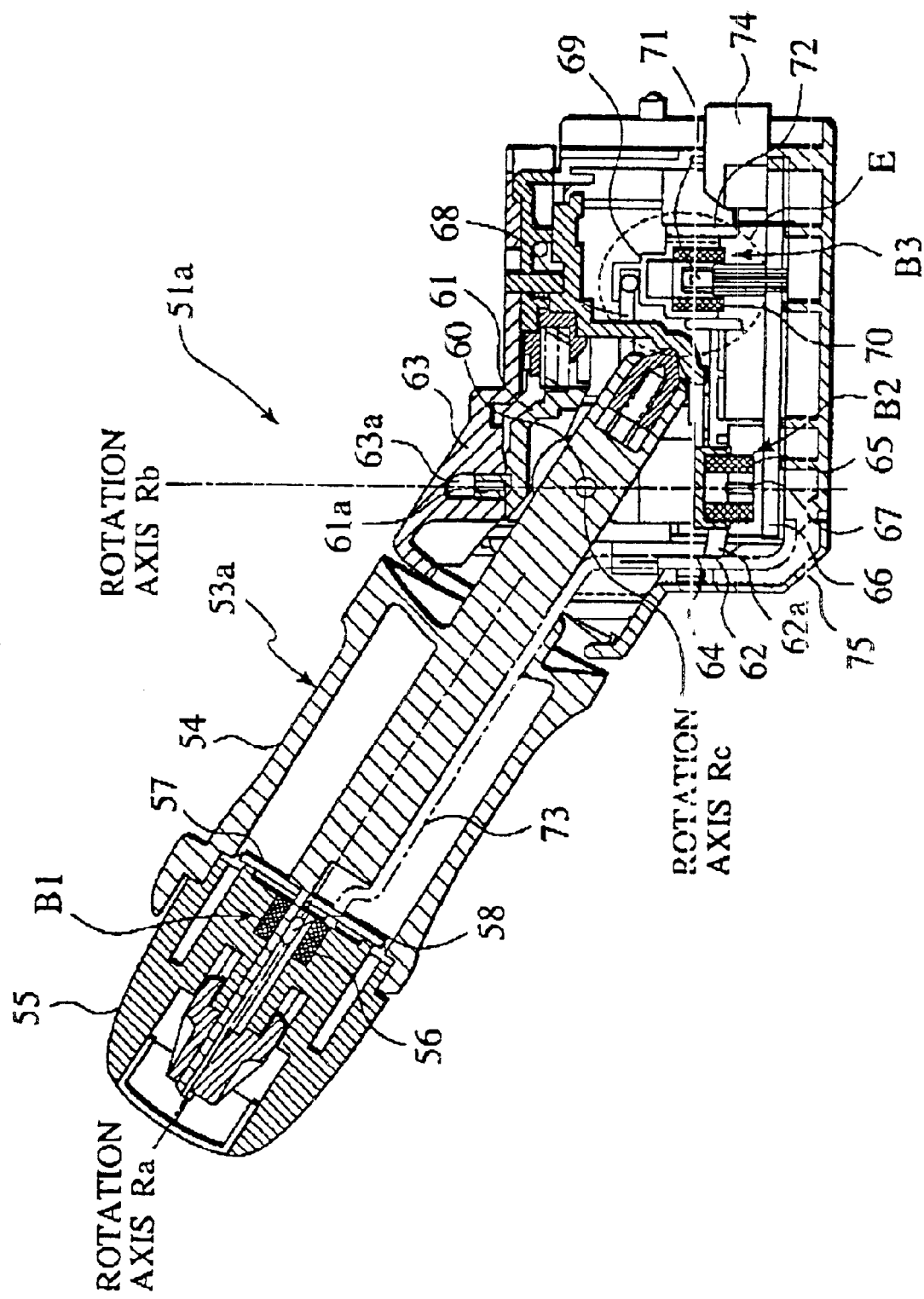
FIG. 20 is a sectional view of the left combination switch according to the fifth embodiment of the present invention.
Figure 21:
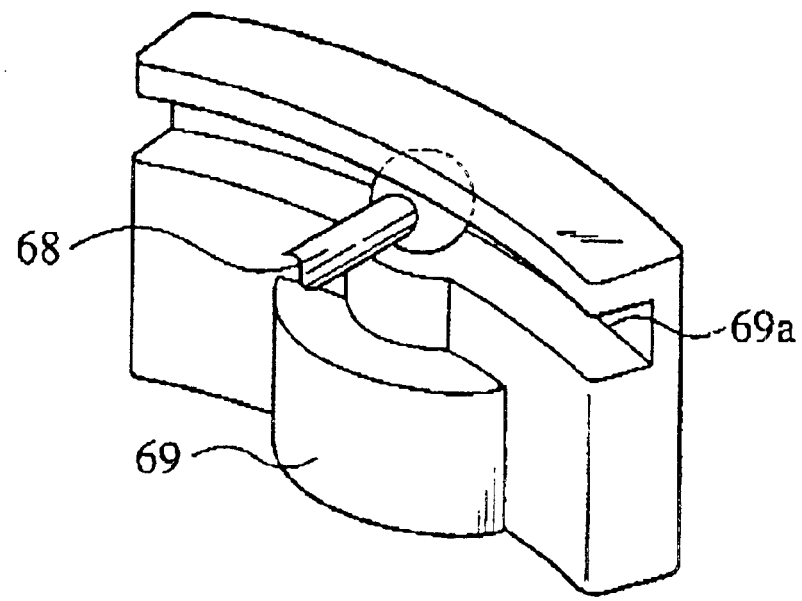
FIG. 21 is a perspective view of a magnet holder in the left combination switch according to the fifth embodiment of the present invention.
Figure 24:
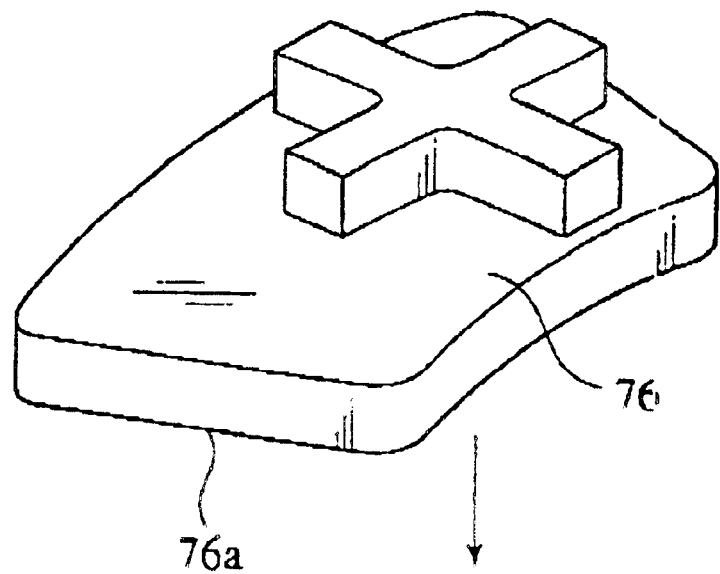
FIG. 24 is a perspective view of a magnet pressing plate in the right combination switch according to the fifth embodiment of the present invention.

The left combination switch 51a will be described with reference to FIGS. 20, 21, and FIGS. 22A to 22C. As shown in FIG. 20, the control lever 53a extended from the steering column 52 includes the lever body 54, and the control knob 55 rotatably provided at a tip of the lever body 54. The first position detector B1 is provided in the inside constituted of the control knob 55 and the lever body 54.

The first position detector B1 is fixed to the control knob 55, and includes a cylindrical first magnet 56 rotated together with the control knob 55, and a first Hall effect sensor 58 as a magnetometric sensor disposed in an internal space of the first magnet 56, and fixed through a substrate 57 to the lever body 54. The first Hall effect sensor 58 detects a magnetic field strength, and converts this into a voltage and outputs it. A second Hall effect sensor 67 or the like described below functions similarly. The first magnet 56 has its axis set to match with a rotation axis Ra of the control knob 55. A rotation of the 35 control knob 55 changes relative rotation positions of the first magnet 56 and the first Hall effect sensor 58. The constitution of the first magnet 56 and the first Hall effect sensor 58 will be detailed later. A detection output of the first Hall effect sensor 58 is led to a control circuit (not shown) for turning the headlight on or the like, and used for control for turning the headlight on.

A lever supporting member 61 is rotatable provided on a base end part of the lever body 54 via a pin 60. The lever supporting member 61 includes a shaft portion 61a extended in a direction orthogonal to the pin 60. The shaft portion 61a is supported on respective bearings 62a and 63a of a case 62 and an upper cover 63. That is, the lever body 54 of the control lever 53a can be swung in a back-and-forth direction of a vehicle (first swinging direction) with the pin 60 as a fulcrum (rotation axis Rc), and also in an up-and-down direction of the vehicle (second swinging direction) with the shaft portion 61a as a fulcrum (rotation axis Rb). When this control lever 53a is swung up and down, the lever supporting member 51 is swung integrally.

The second position detector B2 includes a cylindrical second magnet 65 fixed through a magnet holder 64 to the shaft portion 61a of the lever supporting member 61, and a second Hall effect sensor 67 as a magnetometric sensor disposed in the second magnet 65, and provided on a substrate 66 fixed to the case 62. The second magnet 65 has its axis set to match with an axis of the shaft portion 61a of the lever supporting member 61, and up-and-down swinging of the control lever 53 changes relative rotation positions of the second magnet 65 and the second Hall effect sensor 67. The constitution of the second magnet 65 and the second Hall effect sensor 67 will be detailed later. A detection output of the second Hall effect sensor 67 is led to a control circuit (not shown) for turning a turn signal on, and used for turning the turn signal on or the like.

A magnet operation lever 68 is provided on a base end part of the lever body 54, and a tip of the magnet operation lever 68 is engaged with an engaging groove 69a of a magnet holder 69. As shown in detail in FIG. 21, the engaging groove 69a of the magnet holder 69 is extended in the up-and-down direction of the vehicle. When the lever body 54 of the control lever 53a is swung in the up-and-down direction of the vehicle, the tip of the magnet operation lever 68 is simply slid and moved on the engaging groove 69a. When the lever body 54 of the control lever 53a is swung in the back-and-forth direction of the vehicle, the tip of the magnet operation lever 68 presses the magnet holder 69, and thus the magnetic holder 69 is moved followingly. That is, one-direction swinging transmitting means for transmitting not the vehicle up-and-down swinging of the lever body 54 but only the vehicle back-and-forth swinging of the lever body 54 is composed of the magnet operation lever 68 an the magnet holder 69.

As shown in detail in FIGS. 22A, 22B and 22C, the third position detector B3 includes a cylindrical third magnet 70 fixed in the magnet holder 69, and a third Hall effect sensor 71 as a magnetometric sensor disposed in the third magnet 70, and provided on the substrate 66 fixed to the case 62. A magnet guide 72 is disposed on an outer periphery of the magnet holder 69 and, by this magnet guide 72, the magnet holder 69 and the magnet 70 are accurately moved through an accurate track. When the control lever 53 is swung back and forth of the vehicle, the magnet holder 69 on the base end side of the lever body 54 is swung around the pin 60. This swinging changes an insertion position of the third Hall effect sensor 71 in the third magnet 70. The constitution of the third magnet 70 and the third Hall effect sensor 71 will be detailed later. A detection output of the third Hall effect sensor 71 is led to a control circuit (not shown) for passing (or flashing) driving or the like, and used for controlling the passing (or flashing) driving or the like.

In FIG. 20, reference numerals 73 denote a lead wire, 74 a connector, and 75 an under cover.

The right combination switch 51b will be now described with reference to FIGS. 23, 24, 25A and 25B. In the constitution of the right combination switch 51b, the same reference numerals will be used to designate the same components as those in the left combination switch, so that the description thereof will be omitted, and only different components will be described.

Figure 23:
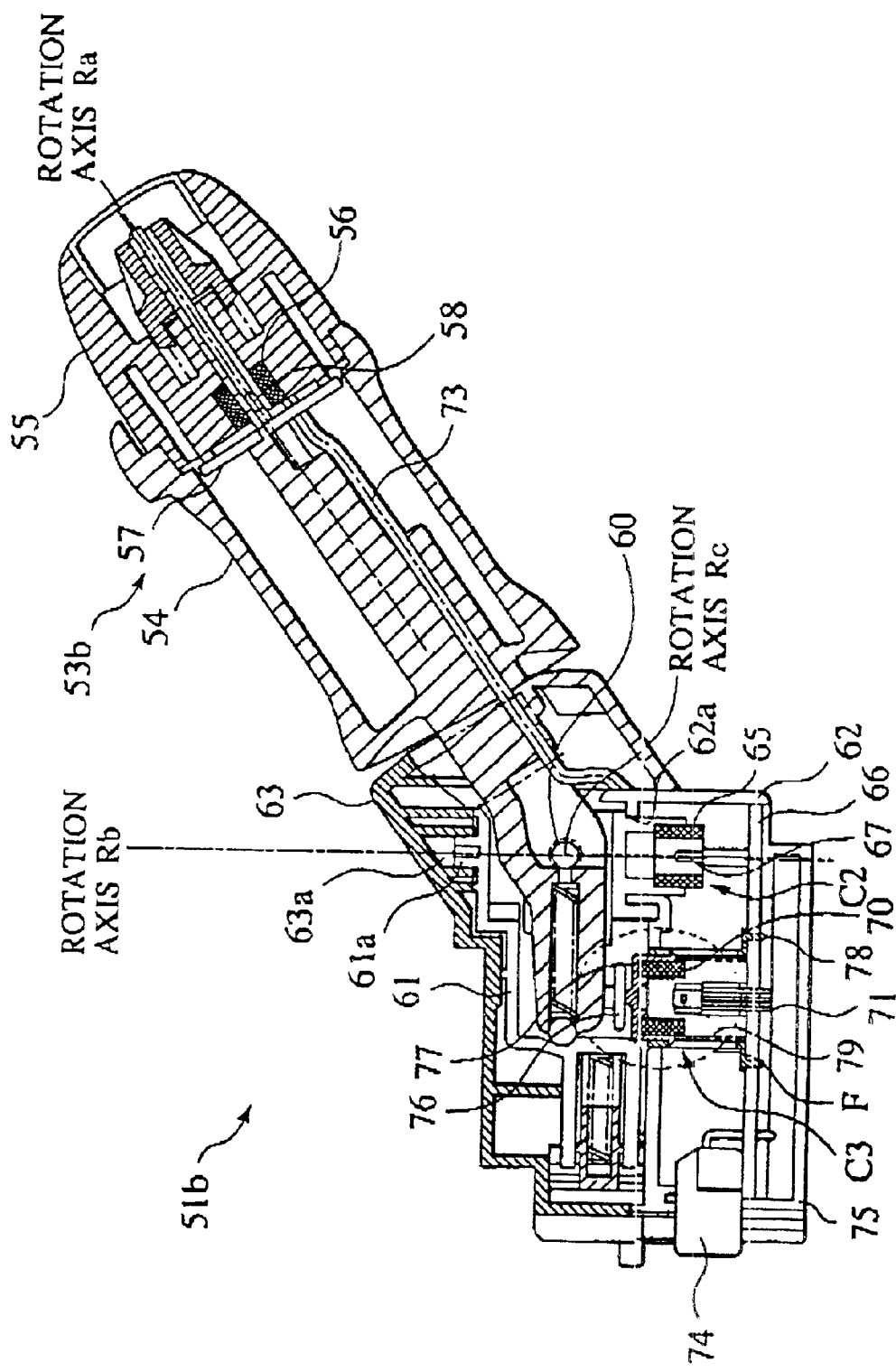
FIG. 23 is a sectional view of the right combination switch according to the fifth embodiment of the present invention.

That is, in FIG. 23, in the right combination switch 51b, as in the case of the left combination switch 51a, the first position detector C1 is constructed for detecting a rotation position of the control knob 55, and the second position detector C2 is constructed for detecting a rotation position of the lever body 54 in the up-and-down direction of the vehicle. A detection output of the second Hall effect sensor 65 of the second position detector C2 is led to a control unit (not shown) for driving a wiper or the like, and used for controlling the driving of the wiper or the like.

Furthermore, a magnet pressing plate 76 is fixed on a base end part of the lever body 54. As shown in detail in FIGS. 24 and 25, a bottom surface side in an up-and-down direction of the vehicle of the magnet pressing plate 76 is formed to be a flat bottom surface 76a. A projection 77a of the magnet holder 77 is abutted on the flat bottom surface 76a of the magnet pressing plate 76. The magnet holder 77 is disposed so as to be freely moved in a back-and-forth direction of the vehicle by a magnet guide 78, and pressed to the magnet pressing plate 76 side by a spring force of a spring 79.

A guide groove 78a is formed in the magnet guide 78, a guide projection 77b is provided in the magnet holder 77 to be engaged with the guide groove 78a, and the magnet holder 77 is accurately moved in the back-and-forth direction of the vehicle by the magnet guide 78. Accordingly, when the lever body 54 of the control lever 53a is swung in the up-and-down direction of the vehicle, the projection 77a of the magnet holder 77 is simple slid relatively on the flat bottom surface 76a of the magnet pressing plate 76. When the lever body 54 of the control lever 53a is swung in the back-and-forth direction of the vehicle, the magnet pressing plate 76 is swung in the back-and-forth direction of the vehicle to press the projection 78a of the magnet holder 78, and the magnet holder 78 is moved against the spring force of the spring 79. That is, one-direction swinging transmitting means for transmitting not the swinging of the vehicle up-and-down direction of the lever body 54 but only the swinging of the vehicle back-and-forth direction of the vehicle of the lever body 54 is composed of the magnet pressing plate 76, the magnet holder 77, the magnet guide 78 and the spring 79.

As shown in detail in FIGS. 25A and 25B, the third position detector 3C includes a cylindrical third magnet 70 fixed in the magnet holder 77, and a third Hall effect sensor 71 as a magnet sensor disposed inside the third magnet 70, and provided on a substrate 66 fixes to a case 62. When the control lever 53 is swung in the back-and-forth direction of the vehicle, the magnet pressing plate 76 on the base end side of the lever body 54 is swung around the pin 60. This swinging changes an insertion position of the third Hall effect sensor in the third magnet 70. The constitution of the third magnet 70 and the third Hall effect sensor 71 will be described later. A detection output of the third Hall effect sensor 71 is led to a control circuit (not shown) for driving a washer or the like, and used for controlling the driving of the washer or the like.

Figure 26A:
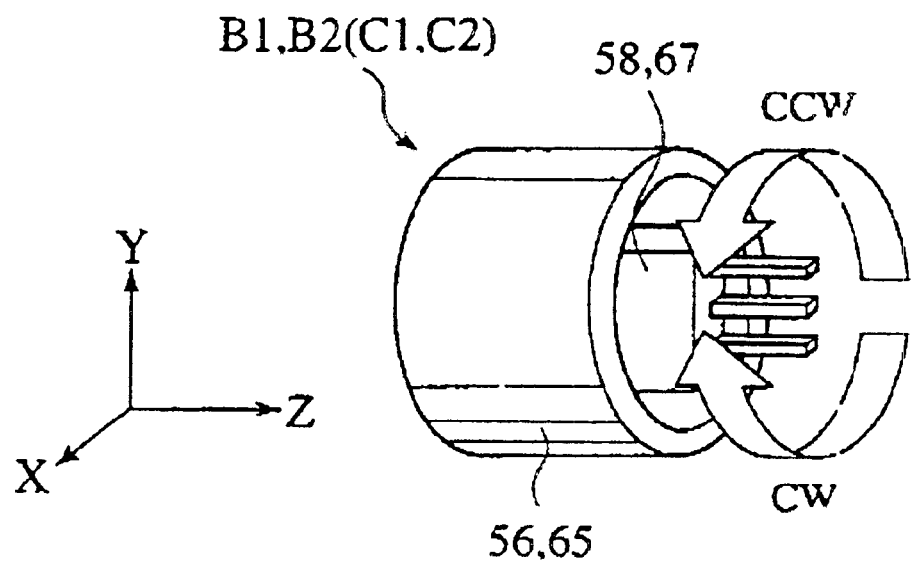
FIG. 26A is a perspective view showing position of magnets and Hall effect sensors at first and second position detectors in the left and right combination switches according to the fifth embodiment of the present invention.

Next. the constitution of the first position detectors B1 and C1, and the second position detectors B2 and C2 of right and left combination switches 51a and 51b will be described in detail. FIG. 26A is a perspective view showing positions of the magnets 56 and 65, and the Hall effect sensors 58 and 67 in the first position detectors B1 and C1, and the second position detectors B2 and C2, FIG. 26B a perspective view showing magnetized states of the magnets 56 and 67, FIG. 27 a characteristic line view showing magnetic field intensities received by the Hall effect sensors 58 and 67 with respect to rotation angles of the magnets 56 and 65, FIG. 28 a characteristic view showing output voltages of the Hall effect sensors 58 and 67 with respect to rotation angles of the magnets 56 and 65 in the cases of the nonlinear Hall effect sensor and the linear Hall effect sensor, FIG. 29 an explanatory characteristic line view showing that a point of ±30° from a position of a rotation angle of 180° is set as a calibration point, and FIG. 30 a view showing a correspondence between a characteristic line indicating an output voltage of the Hall effect sensor 58 with respect to a rotation angle of the control knob 55, and a rotation angle range and an operation state of the control knob 55.

Figure 26B:
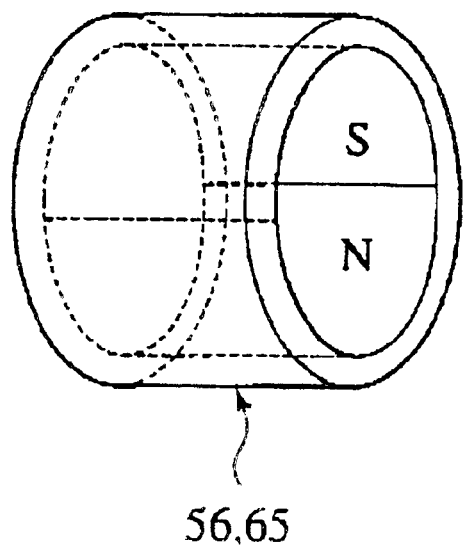
FIG. 26B is a perspective view showing magnetized state of the magnet of FIG. 26A.
Figure 27:
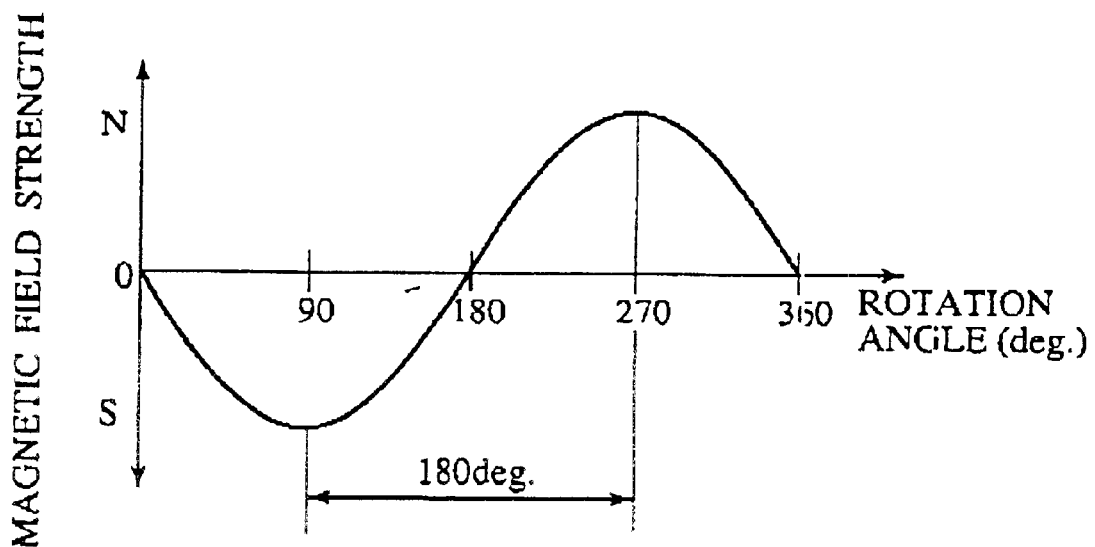
FIG. 27 is a characteristic line diagram showing magnetic field intensities of the Hall effect sensors with respect to rotation angles of the magnets at the first and second position detectors in the left and right combination switches according to the fifth embodiment of the present invention.
Figure 28:
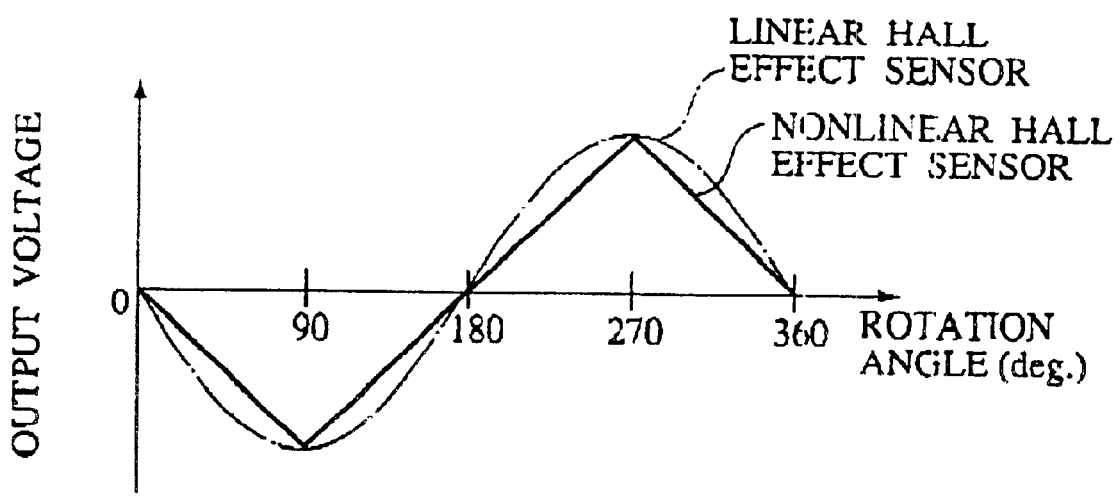
FIG. 28 is a characteristic line diagram showing output voltages of Hall effect sensors with respect to rotation angels of the magnets of FIG. 27 in the cases of nonlinear and linear Hall effect sensors.

As shown in FIGS. 26A and 26B, the magnets 56 and 65 of the first and second position detectors B1, C2, B2 and C2 are magnetized to S and N poles at a rotation angle of 180° in a circumferential direction. In central regions of internal spaces of the magnets 56 and 65, parallel magnetic fields are obtained in directions perpendicular to rational axes. In the first and second Hall effect sensors 58 and 67, approximate central regions in the magnets 56 and 65 are set as detection points, and an X direction of FIG. 26A is set as a direction of magnetic field to be detected. Thus, a magnetic field strength of each of the Hall affect sensors 58 and 67 has an SIN waveform similar to that shown in FIG. 27. If each of the Hall effect sensors 58 and 67 is a linear Hall effect sensor, an output of an SIN waveform similar to that indicated by a chain line shown in FIG. 28 is obtained. If each of the Hall effect sensors 58 and 67 is a nonlinear Hall effect sensor having an SIN waveform-linear waveform conversion characteristic, an output of a triangular waveform similar to that indicated by a solid line in FIG. 25 is obtained. Operation rotation angles of the control knob 55 and the control levers 53a and 53b in a vehicle up-and-down direction are less than 180°. Thus, for example, if a range of 90 to 270° in FIG. 27 is set as a range of rotation angle detection in the vehicle up-and-down direction of the control knob 55 and the control levers 53a and 53b, detection outputs are obtained from the Hall effect sensors 58 and 67 according to rotation positions.

Figure 29:
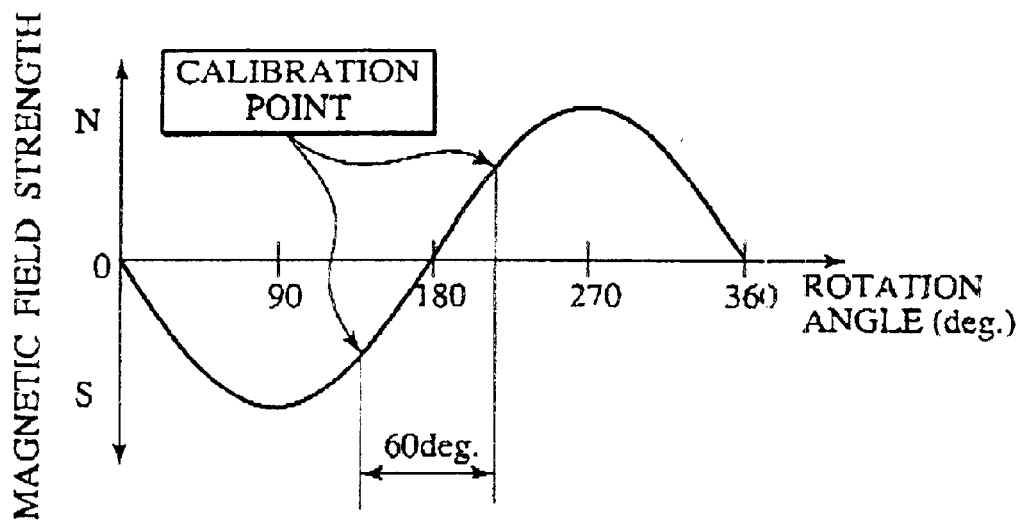
FIG. 29 is an explanatory characteristic line diagram showing that a point of ±30° from a position of a rotation angle 180° is set as a calibration point at a position detector in the combination switch according to the fifth embodiment of the present invention.
Figure 30:
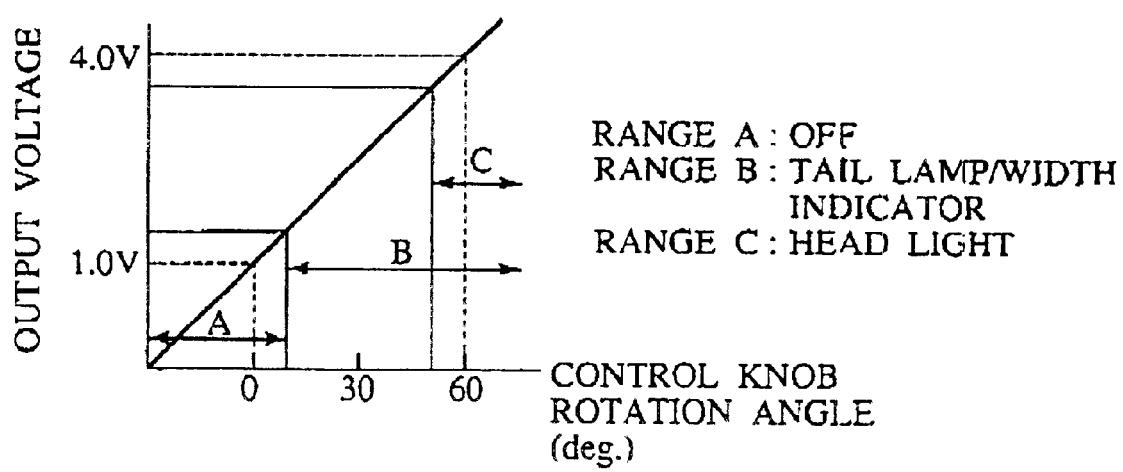
FIG. 30 is a diagram characteristic line of an output voltage of the Hall effect sensor with respect to a rotation angle of a control knob, showing a rotation angle range of the control knob and a corresponding operation state in the combination switch according to the fifth embodiment of the present invention.

Next, the detailed constitution of the first magnet 56 and the first Hall effect sensor 58 at the first position detector B1 will be described as a further specific example. As the first Hall effect sensor 58, the above-described nonlinear Hall effect sensor is used, and a 2-point calibrated programmable Hall effect sensor is used, which can variably set output characteristics according to set levels by setting desired detection levels for detection points of 2 places. An angle detection range of the control knob 55 is 60°. Accordingly, by setting ±30° from a position of a magnetic field 0 (rotation angle: 180°) in FIG. 27 as an angle detection range, the first magnet 56 and the first Hall effect sensor 58 are assembled. Then, in a rotation range of 0 to 60°, as shown in FIG. 29, the Hall effect sensor 58 is calibrated so as to output by 1.0 to 4.0 V. Thus, as shown in FIG. 30, an output waveform changed linearly with respect to a rotation angle is obtained. This output voltage is divided by the number of times of operating a switch (i.e., divided into 3 parts), and the control circuit (not shown) is programmed to correspond to turning the light OFF in a range of an A output range, a tail lamp/width indicator in a range of a B output voltage, and turning the headlight ON in a range of a C output voltage. Incidentally, the constitutions of the first position detector C1 in the right combination switch 51b, and the second position detectors B2 and C2 in the left and right combination switches 51a and 51b can be similarly set.

Figure 31:
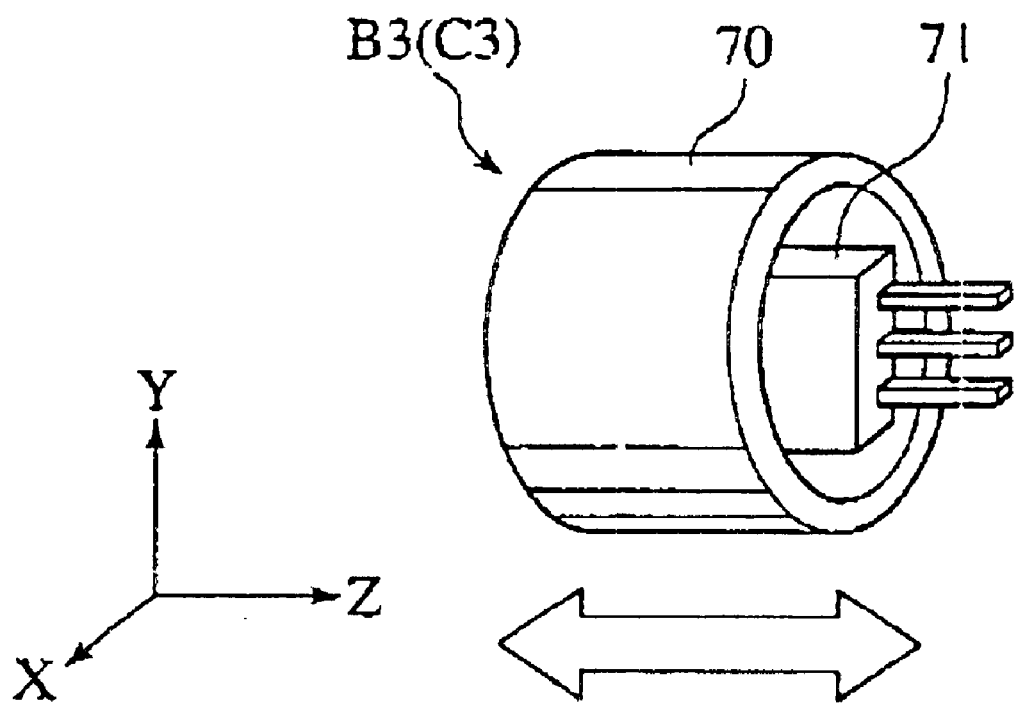
FIG. 31 is a perspective view showing position of the magnet and the Hall effect sensor at the third position detector in the combination switch according to the fifth embodiment of the present invention.
Figure 32:
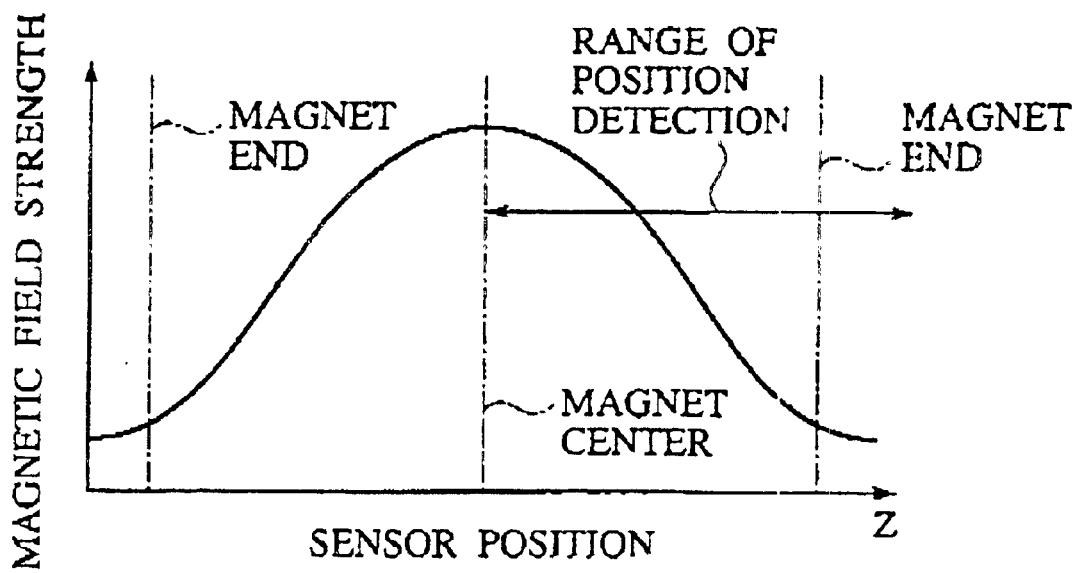
FIG. 32 is a characteristic line diagram showing a magnetic field strength when the Hall effect sensor is moved and inserted into the magnet at the third position detector in the combination switch according to the fifth embodiment of the present invention.
Figure 33:
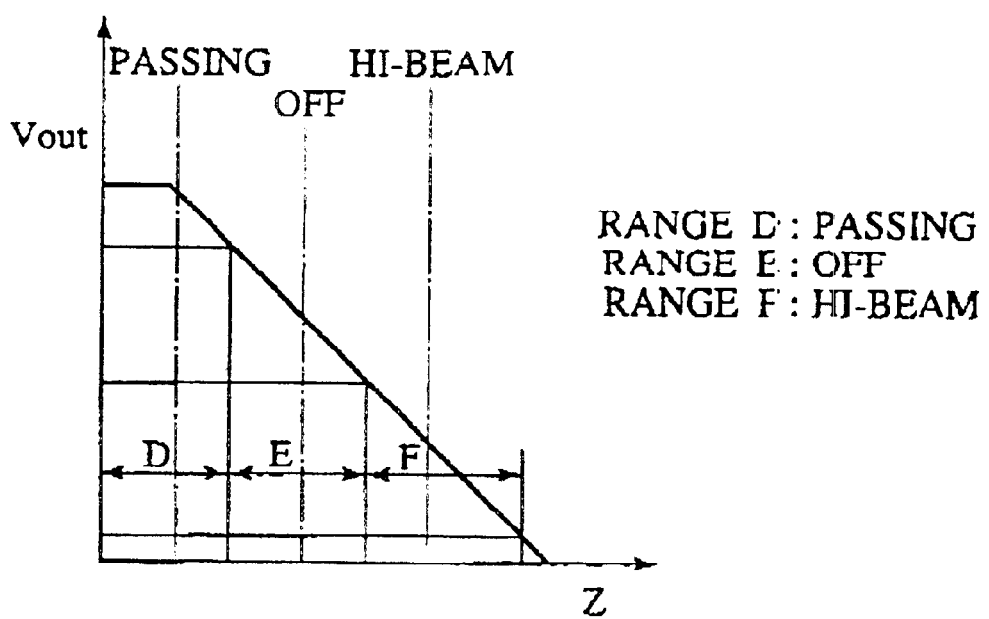
FIG. 33 is a characteristic line diagram of an output voltage of the Hall effect sensor with respect to a movement (from reference position to magnet height) of the magnet, showing a Z-direction moving range of the magnet, and a corresponding operation state in the combination switch according to the fifth embodiment of the present invention.

Next, the constitution of the third position detectors B3 and C3 in the left and right combination switches 51a and 51b will be described in detail. FIG. 31 is a perspective view showing positions of magnets 70 and Hall effects sensors 71 in the third position detectors B3 and C3. FIG. 32 a characteristic line view showing a magnetic field strength when the Hall effect sensor 71 is inserted and moved into the magnet 70. FIG. 33 a view showing a correspondence between an output voltage of the Hall effect sensor 71 with respect to a movement of the magnet 70 (magnet height from a reference position), and a Z-direction moving range and an operation state of the magnet 70, and FIG. 34 a view showing a correspondence between a characteristic line of a magnetic field strength when the Hall effect sensor 71 is inserted and moved into the magnet 70, and a movement (magnet height from the reference position) and an operation state of the magnet 70.

As shown in FIG. 31, the magnet 70 of each of the third position detectors B3 and C3 has S and N poles magnetized by a rotation angle of 180° in a circumferential direction. In a central region of a space inside the magnet 70, parallel magnetic fields are obtained in a direction perpendicular to a rotational axis. The third Hall effect sensor 71 is set to vary an insertion position with a direction of magnetic field to be detected of the hall effect sensor directed to the N or S pole side of the magnet, and a detection point set on an approximate center axis (Z axis of FIG. 31) in the magnet 70. Accordingly, a magnetic field strength received by the Hall effect sensor 71 has a chevron waveform similar to that show in FIG. 32. If the Hall effect sensor 71 is a linear Hall effect sensor, an output of a chevron waveform shown in FIG. 32 is obtained. If the Hall effect sensor 71 is a nonlinear Hall effect sensor having a chevron waveform-linear waveform conversion characteristic, an output of a trapezoidal waveform is obtained. Operation rotation angles of the lever main bodies 54 of the control levers 53a and 53b are small. Accordingly, if assembling is carried out by, for example as shown in FIG. 33, setting a range of a half of the trapezoidal waveform as a range of rotation angle detection of the control levers 53a and 53b in the vehicle back-and-forth direction, a detection output is obtained from the Hall effect sensor 71 according to a rotation position. This output voltage is divided by the number of times of switching (i.e., into 3 parts), and the control circuit (not shown) is programmed to correspond to passing (or flashing) in an output voltage range of A, OFF in an output voltage range of B, and a high beam in an output voltage range of C. Note that the constitution of the third position detector C3 in the right combination switch 51b can be approximately set. FIGS. 25A and 25B show the cases of assembling by using the range of a half of a trapezoidal or chevron waveform. A case where the Hall effect sensor 71 is positioned in an end position of the magnet 70 (case of FIG. 25A) is set as washer OFF, and a case where the Hall effect sensor 71 is positioned in a central region of the magnet 70 (case of FIG. 25B) is set as washer ON.

Figure 34:
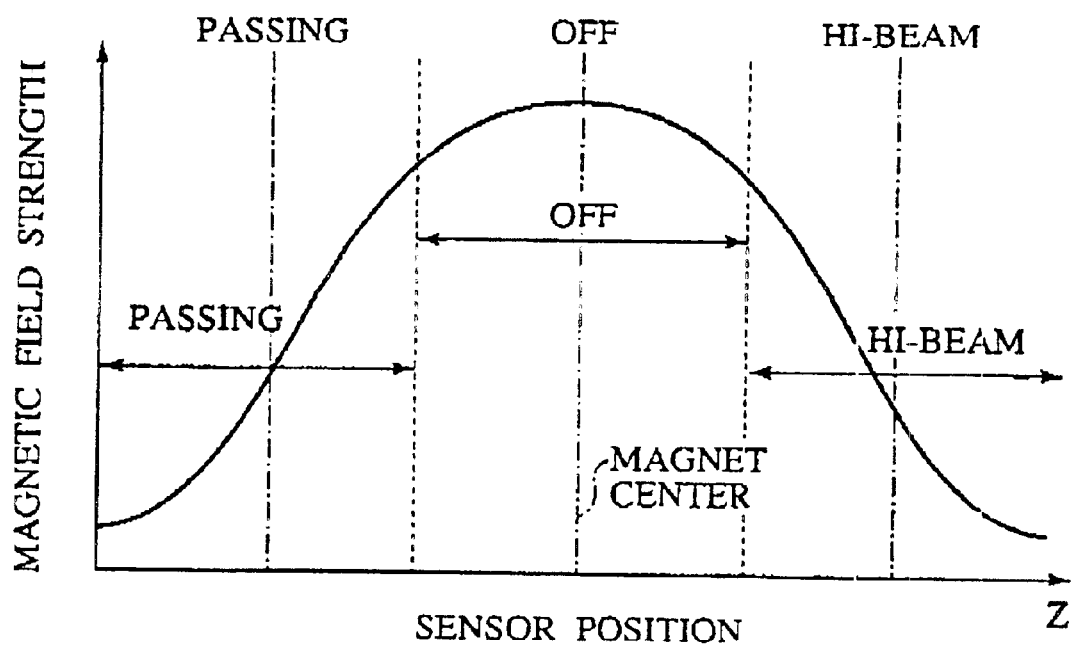
FIG. 34 is a characteristic line diagram of a magnetic field strength when the Hall effect sensor is moved and inserted into the magnet, showing position of the magnet from reference position to magnet height and a corresponding operation state in the combination switch according to the fifth embodiment of the present invention.

If identical control is carried out in passing (or flashing) and a high beam, the Hall effect sensor 71 may be a linear Hall effect sensor and, as shown in FIG. 34, assembling may be carried out by setting an all-area range of the chevron waveform as a range of rotation angle detection of the control levers 53a and 53b in the back-and-forth direction of the vehicle. Then, as shown in FIG. 34, OFF is set when the Hall effect sensor 71 is positioned in the central region of the magnet 70 (in the case of FIG. 22B), and passing (or flashing) and a high beam when the Hall effect sensors 71 are positioned in both ends of the magnet 70 (in the cases of FIGS. 22A and 22C).

Next, driving circuits of the Hall effect sensors 58, 67 and 71 will be described with reference to FIGS. 35A 35B and FIGS. 36A and 36B.

Figure 35B:
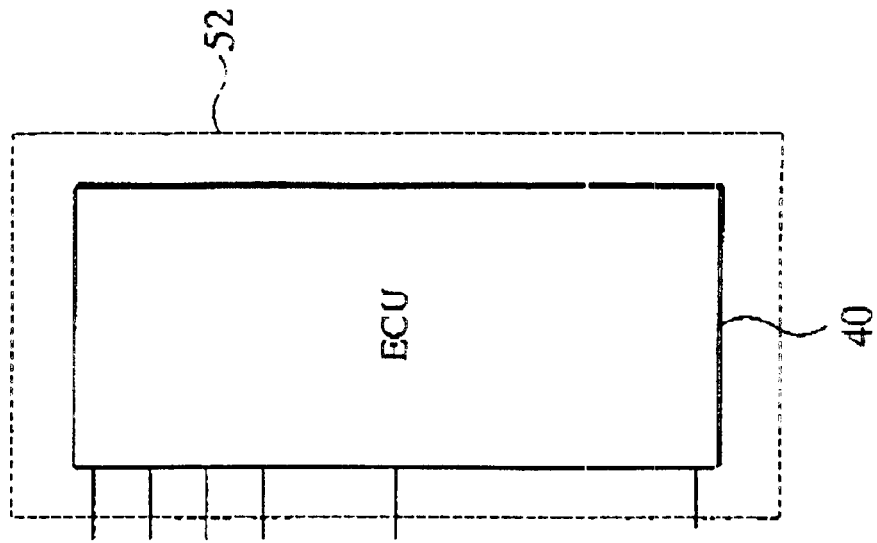
FIG. 35B is a diagram showing an electronic control unit for controlling the Hall effect sensor in the combination circuit according to the fifth embodiment of the present invention.
Figure 35A:
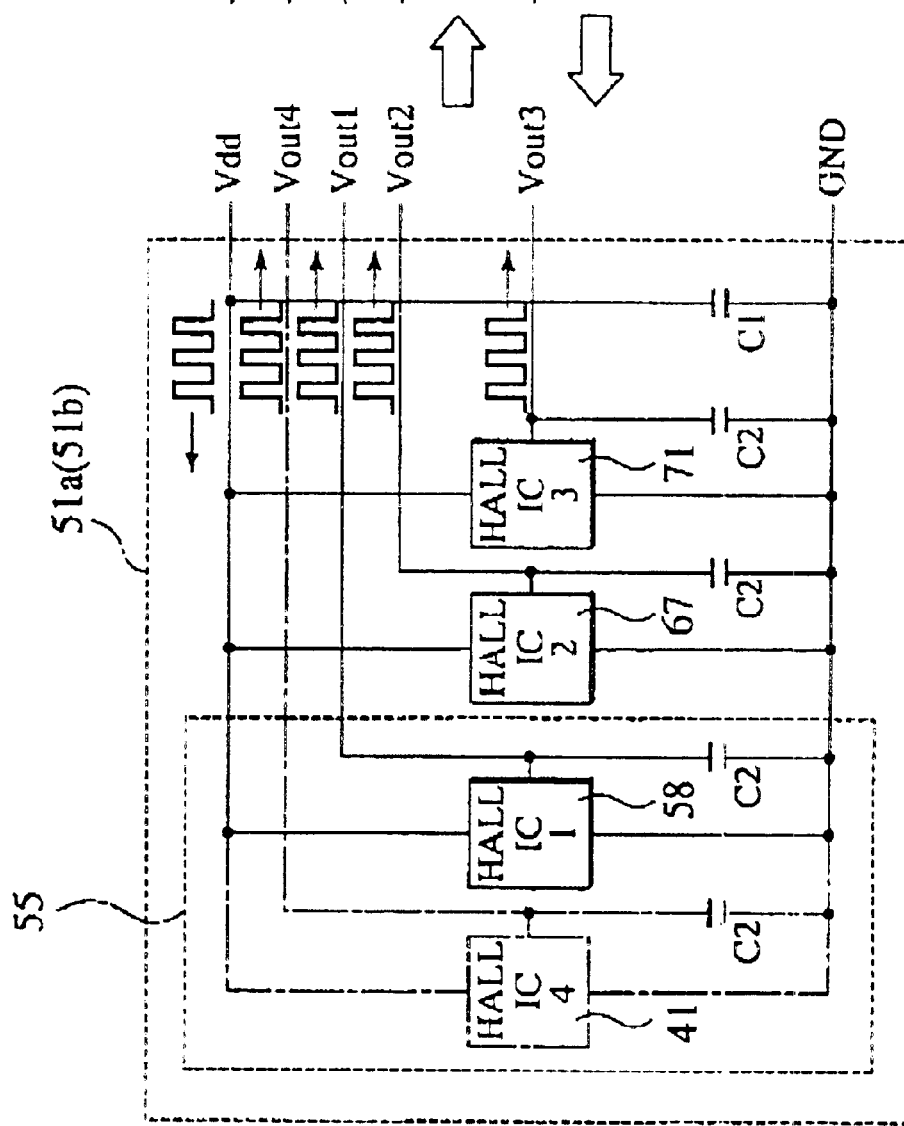
FIG. 35A is a circuit diagram showing wiring to the Hall effect sensor in the combination switch according to the fifth embodiment of the present invention.

In the driving circuit of each of FIGS. 35A and 35B, by using Vdd (power supply voltage) and GND (earth) in common, the number of lead wires 73 to the control knob 55 side, and the number of terminals of a connector 74 in connection to the steering column 52 (stationary portion) are reduced to minimums. To reduce power consumption thereof as much as possible, pulse voltages are sequentially supplied from the electronic control unit 40 of the steering column 52 (stationary portion) side to Vdd, and outputs from the Hall effect sensors 58, 67 and 71 are detected by the electronic control unit 40 in the steering column 52 (stationary portion) side. Constant voltage may be supplied to the VDD when ignition (I/G) is on, and pulse voltage may be supplied thereto only when the ignition (I/G) is off. For example, if a Hall effect sensor 41 is added in the control knob 55 side, outputs from the four it Hall effect sensors 58, 67, 71 and 41 are detected by the electronic control unit 40.

Figures 36A, 36B:
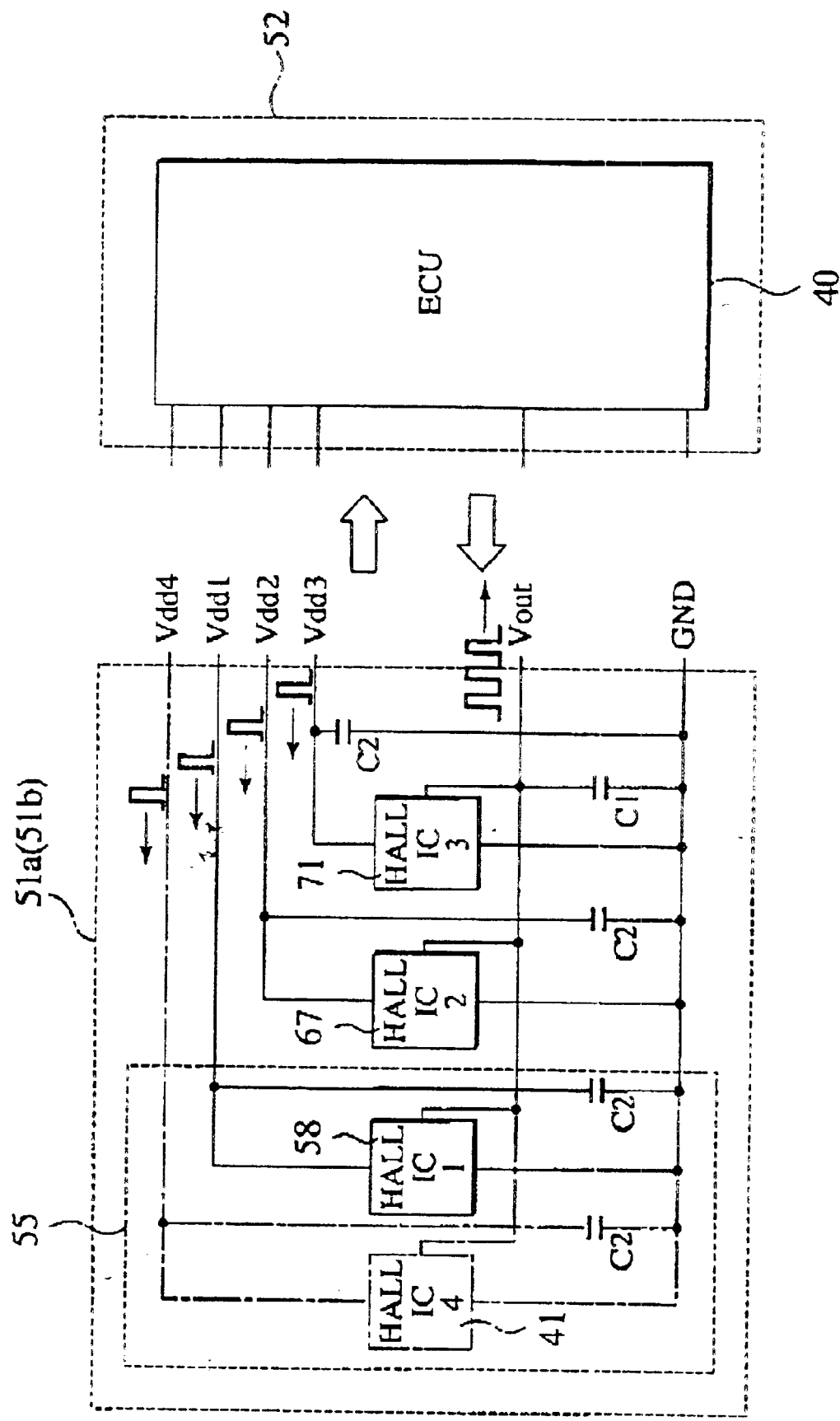
FIG. 36A is a circuit diagram showing an example of other wiring to the Hall effect sensor in the combination switch according to the fifth embodiment of the present invention.
FIG. 36B is a diagram showing an electronic control unit for controlling the Hall effect sensor in the combination switch according to the fifth embodiment of the present invention.

In the driving circuit of each of FIGS. 36A and 36B, by using Vout (detection output) and GND (earth) in common, the number of lead wires 73 to the control knob 55 side, and the number of terminals of a connector 74 in connection to the steering column 52 (stationary portion) are reduced to minimums. To reduce power consumption thereof as much as possible, pulse voltages are sequentially supplied from the electronic control unit 40 of the steering column 52 (stationary portion) side to Vdd of the three Hall effect sensors 58, 67 and 71, and outputs made in response from the Hall effect sensors 58, 67 and 71 are detected by the electronic control unit 40 in the steering column 52 (stationary portion). For example, if a Hall effect sensor 41 is added in the control knob 55 side, outputs from the four Hall effect sensors 58, 67, 71 and 41 are detected by the electronic control unit 40.

In the foregoing constitution, when the control knobs 55 of the left and right control levers 53a and 53b are rotated with respect to the lever main bodies 54 (θ-direction operation of FIG. 19), the first magnets 56 of the first position detectors B1 and C1 are rotated. Changes in magnetic field intensities by the rotations are detected and outputted by the first Hall effect sensors 58, and turning the headlight on or the like is controlled according to the output levels. When the entire control levers 53a and 53b are swung in the up-and-down direction of the vehicle (α-direction operation of FIG. 19), the second magnets 65 of the second position detectors B2 and C2 are rotated. Changes in magnetic field intensities by the rotations are detected and outputted by the second Hall effect sensors 67, and turning the turn signal on or the like is controlled according to the output levels. When the entire control levers 53 are swung in the back-and-forth direction of the vehicle (β-direction operation of FIG. 19), the third Hall effect sensors 71 are moved in an inserting direction inside the third magnets 70 of the third position detectors B3 and C3. Changes in magnetic field intensities by the movements are detected and outputted by the third Hall effect sensors 71, and passing (or flashing), a washer or the like is controlled according to the output levels.

As described above, in the combination switches 51a and 51b, the first position detectors B1 and C1 include the cylindrical magnets 56 disposed around the rotation axes of the control levers 53a and 53b, rotations of the control levers 53a and 53b changing relative rotation positions with the magnets 56, and the Hall effect sensors 58 for detecting magnetic field intensities changed according to the rotation positions. The second position detectors B2 and C2 include the cylindrical magnets 65 disposed around the swing axes of the lever main bodies 54, the swinging of the lever main bodies 54 changing relative rotation positions with the magnets 65, and the Hall effect sensors 67 for detecting magnetic field intensities changed according to the rotation positions. The third position detectors B3 and C3 include the cylindrical magnets 70, the swinging of the lever main bodies 54 changing relative insertion positions into the magnets 70, and the Hall effect sensors 71 for detecting magnetic field intensities changed according to the insertion positions. Thus, since the magnets 56, 65 and 70 similar in shapes are used in the first position detectors B1 and C1, the second position detectors B2 and C2, and the third position detectors B3 and C3, only one type of metallic mold is necessary for manufacturing the magnets 56, 65 and 70, thereby reducing costs.

That is, when the lever body 54 is provided in the steering column 52 so as to be freely strung in two directions, in the case of one rotation axis Rb, the cylindrical magnet 65 and the magnetometric sensor 67 can be disposed around the axial center thereof. In this case of the other rotation axis Rc, the cylindrical magnet 70 and the magnetometric sensor 71 cannot be disposed around the axial center thereof while a compact structure thereof is maintained. Accordingly, to solve this problem, an arrangement is made such that the swinging of the lever body 54 changes the relative insertion position of the magnetometric sensor 71 into the cylindrical magnet 70, thereby making the cylindrical magnet 70 usable.

In the embodiment, the constitution where the lever body 54 is provided in the steering column 52 so as to be freely swung in the two directions means that the lever body 54 is supported on the lever supporting member 61 so as to be freely swung in the first swinging direction, and the lever supporting member 61 is supported on the steering column 52 so as to be freely swung in the second swinging direction orthogonal to the first swinging direction. Thus, since the lever body 54 is swung only in the two directions orthogonal to each other on the steering column 52, certainty of operability thereof is enhanced.

In the embodiment, the one-direction swinging transmitting means is provided to transmit not the vehicle up-and-down direction (second swinging direction) swinging of the lever body 54, but the vehicle back-and-forth direction (first swinging direction) swinging of the lever body 54. By this one-direction swinging transmitting means 71, the relative insertion positions of the magnets 70 and the Hall effect sensors 71 of the third position detectors A3 and B3 are changed. Accordingly, at the third position detectors A3 and B3, the Hall effect sensor 11 is moved to the predetermined insertion positions in the magnet 70 irrespective of the position of the lever body 54 in the vehicle up-and-down direction (second swing position). Therefore, wherever the lever body 54 is positioned in the vehicle up-and-down direction (second swinging direction). no changes occur in the operation range of the lever body 54 in the vehicle back-and-forth direction (first swinging direction), the operation range being maintained constant, thus giving no uncomfortable feelings to a driver.

In the embodiment, for the Hall effect sensors 58, 67 and 71 as magnetometric sensors, the nonlinear Hall effect sensors for outputting nonlinear characteristics to detected magnetic field intensities, and linear outputs may be obtained from the nonlinear Hall effect sensors with respect to position changing quantities of the lever body 54 and the control knob 55. In this constitution, since linear detection outputs are obtained for the position changes of the control levers 53a and 53b, relations between the positions of the control levers 53a and 53b and the detection outputs of the Hall effect sensor 58, 67 and 71 can be easily understood, and processing of detection signals of the Hall effect sensors 58, 67 and 71 can be facilitated.

In the embodiment, for the Hall effect sensors 58, 67 and 71 as magnetometric sensors, 2-point calibrated programmable magnetometric sensors may be employed, which can variably set output characteristics according to set values by setting desired output levels at detection points of two places. Accordingly, even in the case where the moving ranges of the control levers 53a and 53b vary, the detection levels of the control circuit for taking in the detection outputs of the Hall effect sensors 58, 67 and 71, or the like, detection outputs of the output characteristics can be made in a range according to the moving ranges of the control levers 53a and 53b, and matching the detection level of the control circuit. Thus, the Hall effect sensors 58, 67 and 71 can be made compatible to functions of various vehicle types. Therefore, it is possible to eliminate, reduce to a minimum, changes of the microcomputer or the program for converting positional information of the control levers 53a and 53b into a control signal of a corresponding vehicle function.

In the embodiment, by using the digital output types for the Hall effect sensors 58, 67 and 71, reliability of position detection can be improved more.

In the embodiment, the left and right combination switches 51a and 51b both include the lever main bodies 54 of the control levers 53a and 53b on the steering columns 52 so as to be freely swung in the two directions, control knobs 55 rotatably provided on the lever main bodies 54, and the first to third position detectors B1, B2, B3, C1, C2 and C3. However, the present invention can be applied to a case where either one or both of the combination switches 51a and 51b include only the second position detectors B2 and C2 and the third position detectors 33 and C3 without any control knobs 55 provided in the lever main bodies 54. Also in this case, since cylindrical magnets can be used, magnet costs can be reduced.

According to the embodiment, the magnets 56, 65 and 70 are provided in the moving sides, and the Hall effect sensors 58, 67 and 71 are provided in the fixed sides. Accordingly, the magnets 56, 65 and 70, and the Hall effect sensors 58, 67 and 71 are configured so as to be moved relative to each other in conjunction with then operations of the control levers 53. Conversely, the magnets 56, 65 and 70 may be provided in the fixed sides, and the Hall effect sensors 58, 67 and 71 may be provided in the moving sides. Preferably, however, the Hall effect sensors 58, 67 and 71 are provided in the fixed sides, because of advantages including easier wiring and the like.

The preferred embodiments described herein are illustrative and not restrictive, and the invention may be practiced or embodied in other ways without departing from the sprit or essential character thereof. The scope of the invention being indicated by the claims, and all variations which come within the meaning of claims are intended to be embraced herein.

What is claimed is:

1. A combination switch comprising:
   a lever member operable to move in a plurality of patterns relative to a stationary portion; and
   a plurality of position detectors, each associated with a different one of the plurality of patterns, configured to detect a position of the lever member, and comprising a magnet and a Hall effect sensor for detecting a strength of a magnetic field of the magnet, the magnet and the Hall effect sensor being configured to have variable relative positions to each other as the lever member moves.

2. A combination switch according to claim 1, wherein the Hall effect sensor outputs linear or nonlinear characteristics to a magnetic field strength to be detected, in dependence to a position changing quantity of the lever member.

3. A combination switch according to claim 2, wherein the Hall effect sensor comprises a programmable Hall effect sensor capable of 2-point calibration for adjusting output values from the Hall effect sensor to provide a variable output range.

4. A combination switch according to claim 1, wherein the Hall effect sensor includes one or more of Hall elements lined up in a direction of movement of the Hall effect sensor relative to the magnetic field of the magnet, each of the Hall elements outputs binary values or codes to be used to obtain a positional information of the lever member.

5. A combination switch according to claim 1, wherein the magnet has a cylindrical shape, an inner periphery thereof is magnetized S and N alternately in a circumferential direction, and the Hall effect sensor is disposed inside the magnet and configured to rotate relative to the magnet as the lever member moves.

6. A combination switch according to claim 1, wherein the magnet has a plate shape and is perpendicularly magnetized, and the Hall effect sensor is disposed to one side of the magnet in a perpendicular direction, wherein the magnet and Hall effect sensor are configured for relative movement in the perpendicular direction as the lever member moves.

7. A combination switch according to claim 1, wherein the magnet has a cylindrical shape, an outer periphery thereof is magnetized S and N alternately in a circumferential direction, and the Hall effect sensor is disposed outside the magnet and configured to rotate relative to the magnet as the lever member moves.

8. A combination switch according to claim 1, wherein the magnet has a disk shape and its top or bottom face is alternately magnetized S and N in a circumferential direction thereof, and the Hall effect sensor is disposed in proximity to the magnet and configured to rotate relative to the magnet as the lever member moves.

9. The combination switch as in claim 1, wherein the lever member is supported on a lever supporting member such that one of the plurality of patterns includes swinging the lever member in a first swinging direction relative to the stationary portion, and another of the plurality of patterns includes swinging the lever member in a second swinging direction orthogonal to the first swinging direction.

10. The combination switch as in claim 1, wherein the magnet and the Hall effect sensor of each of the plurality of position detectors are configured to produce a range of output corresponding to the motion of the lever member relative to the stationary portion in one of the plurality of patterns,
wherein the range of output is divided into a plurality of ranges, each of the plurality of ranges corresponding to a different controlled function.

11. The combination switch as in claim 1, further including a control knob rotatably provided on the lever member, wherein the magnet is cylindrical and disposed around a rotation axis of the control knob, and the magnet is rotatable relative to the hall effect sensor to have a variable relative position to each other as the control knob rotates.

12. A combination switch comprising:
a lever member operable to move relative to a stationary portion; and
a first position detector for detecting a position of the lever member, comprising a magnet and a Hall effect sensor for detecting a strength of a magnetic field of the magnet, the magnet and the Hall effect sensor being configured to have variable relative positions to each other as the lever member moves,
wherein the magnet has a cylindrical shape, an inner periphery thereof is magnetized S and N alternately in a circumferential direction, and the Hall effect sensor is disposed inside the magnet and configured to rotate relative to the magnet as the lever member moves.

13. The combination switch as in claim 12, wherein the Hall effect sensor outputs linear or nonlinear characteristics to a magnetic field strength to be detected, in dependence to a position changing quantity of the lever member.

14. The combination switch as in claim 12, wherein the Hall effect sensor comprises a programmable Hall effect sensor capable of 2-point calibration for adjusting output values from the Hall effect sensor to provide a variable output range.

15. The combination switch as in claim 12, wherein the magnet and the Hall effect sensor are configured to produce a range of output corresponding to the motion of the lever member relative to the stationary portion,
wherein the range of output is divided into a plurality of ranges, each of the plurality of ranges corresponding to a different controlled function.

16. The combination switch as in claim 12, further including a control knob rotatably provided on the lever member, wherein the magnet is cylindrical and disposed around a rotation axis of the control knob, and the magnet is rotatable relative to the hall effect sensor to have a variable relative position to each other as the control knob rotates.

17. The combination switch as in claim 12, further including a second position detector for detecting a position of the lever member during movement in a pattern different from a pattern detected by the first position detector, the second position detector comprising a magnet and a hail effect sensor for detecting a strength of a magnetic field of the magnet, the magnet and the hall effect sensor of the second position detector being configured to have variable relative positions to each other as the lever member moves in the pattern different from the pattern detected by the first position detector,
wherein the magnet of the second position detector has a plate shape and is perpendicularly magnetized, and the Hall effect sensor of the second position detector is disposed to one side of the magnet in a perpendicular direction, wherein the magnet and Hall effect sensor of the second position detector are configured for relative movement in the perpendicular direction as the lever member moves.

18. A combination switch comprising:
a lever member operable to move relative to a stationary portion; and
at least one position detector for detecting a position of the lever member, the at least one position detector comprising a magnet and a Hall effect sensor for detecting a strength of a magnetic field of the magnet, the magnet and the Hall effect sensor being configured to produce a range of output corresponding to the motion of the lever member relative to the stationary portion,
wherein the range of output is divided into a plurality of ranges, each of the plurality of ranges corresponding to a different controlled function.

19. The combination switch as in claim 18, wherein the Halt effect sensor outputs linear or nonlinear characteristics to a magnetic field strength to be detected, in dependence to a position changing quantity of the lever member.

20. The combination switch as in claim 18, wherein the Hall effect sensor comprises a programmable Hall effect sensor capable of 2-point calibration for adjusting output values from the Hall effect sensor to provide a variable output range.

21. The combination switch as in claim 18, further including a control knob rotatably provided on the lever member, wherein the magnet is cylindrical and disposed around a rotation axis of the control knob, and the magnet is rotatable relative to the hail effect sensor to have a variable relative position to each other as the control knob rotates.

22. A combination switch according to claim 18, wherein the magnet has a cylindrical shape, an inner periphery thereof is magnetized S and N alternately in a circumferential direction, and the Hall effect sensor is disposed inside the magnet and configured to rotate relative to the magnet as the lever member moves.

23. A combination switch according to claim 18, wherein the magnet has a plate shape and is perpendicularly magnetized, and the Hall effect sensor is disposed to one side of the magnet in a perpendicular direction, wherein the magnet and Hall effect sensor are configured for relative movement in the perpendicular direction as the lever member moves.

24. A combination switch according to claim 18, wherein the lever member is supported on a lever supporting member configured to allow the lever member to swing in a first swinging direction relative to the stationary portion, and in a second swinging direction orthogonal to the first swinging direction.

* * * * *

UNITED STATES PATENT AND TRADEMARK OFFICE
CERTIFICATE OF CORRECTION

PATENT NO. : 6,873,233 B2
DATED : March 29, 2005
INVENTOR(S) : Toshiki Sugiyama et al.

It is certified that error appears in the above-identified patent and that said Letters Patent is hereby corrected as shown below:

Column 21,
Line 66, "hall" should read -- Hall --.

Column 22,
Lines 34 and 42, "hall" should read -- Hall --.
Line 40, "hail" should read -- Hall --.

Column 23,
Line 2, "Halt" should read -- Hall --.
Line 14, "hail" should read -- Hall --.

Signed and Sealed this

Sixteenth Day of August, 2005

JON W. DUDAS
*Director of the United States Patent and Trademark Office*